United States Patent
Govindaraman

(10) Patent No.: US 6,707,396 B2
(45) Date of Patent: Mar. 16, 2004

(54) DEVICE AND METHOD FOR PARALLEL PROCESSING IMPLEMENTATION OF BIT-STUFFING/UNSTUFFING AND NRZI-ENCODING/DECODING

(75) Inventor: Ravikumar Govindaraman, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/797,026

(22) Filed: Mar. 1, 2001

(65) Prior Publication Data

US 2002/0163452 A1 Nov. 7, 2002

(51) Int. Cl.[7] ................................................ H03M 7/00
(52) U.S. Cl. ......................................... 341/50; 341/51
(58) Field of Search ............................ 341/50; 375/112, 375/117, 118; 370/102

(56) References Cited

U.S. PATENT DOCUMENTS 5,280,502 A * 1/1994 Niegel et al. ................ 375/112

FOREIGN PATENT DOCUMENTS

GB          0 480 566 A2 *  1/1991    ............. H04J/3/07

* cited by examiner

Primary Examiner—Jean Bruner Jeanglaude
Assistant Examiner—Joseph Lauture
(74) Attorney, Agent, or Firm—Bever, Hoffman & Harms, LLP; Jeanette S. Harms

(57) ABSTRACT

A data processing system having a device for processing data bits in parallel to generate bit-stuffed data, bit-unstuffed data, Non-Return-to-Zero-Inverted (NRZI) encoded data or NRZI-decoded data. The data processing system has a system clock operating at a system clock rate S. The device includes a data processing device and a local clock operating at a local clock rate L. The data processing device has a data storage element and a processing circuit and operates at the local clock rate L. The data storage element receives a number of bits N, where N is defined by the relation $N=S/L$. The processing circuit also generates N processed data bits. Bit-stuffing/unstuffing and NRZI-encoding/decoding is implemented on the received data through execution of a parallel processing operation on the data at a desired local clock rate

90 Claims, 16 Drawing Sheets

DEVICE AND METHOD FOR PARALLEL PROCESSING IMPLEMENTATION OF BIT-STUFFING/UNSTUFFING AND NRZI-ENCODING/DECODING

FIELD OF THE INVENTION

This invention relates to data manipulation in data processing systems utilizing Universal Serial Bus (USB) devices and, more particularly, to bit-stuffing/unstuffing and NRZI-encoding/decoding in USB devices.

BACKGROUND OF THE INVENTION

In transmitting and receiving data in within data processing systems, it is sometimes necessary to manipulate the data. Operations such as bit-stuffing/unstuffing and NRZI-encoding/decoding may be performed on data at various points in a data processing system. It is desirable that all the system components operate at a high clock rate. However, different components of the data processing system often operate at different clock rates. In components designed for operation at lower clock rates, implementing bit-stuffing/unstuffing and NRZI encoding/decoding at the higher clock rate may be very difficult.

DETAILED DESCRIPTION

Figure 1:
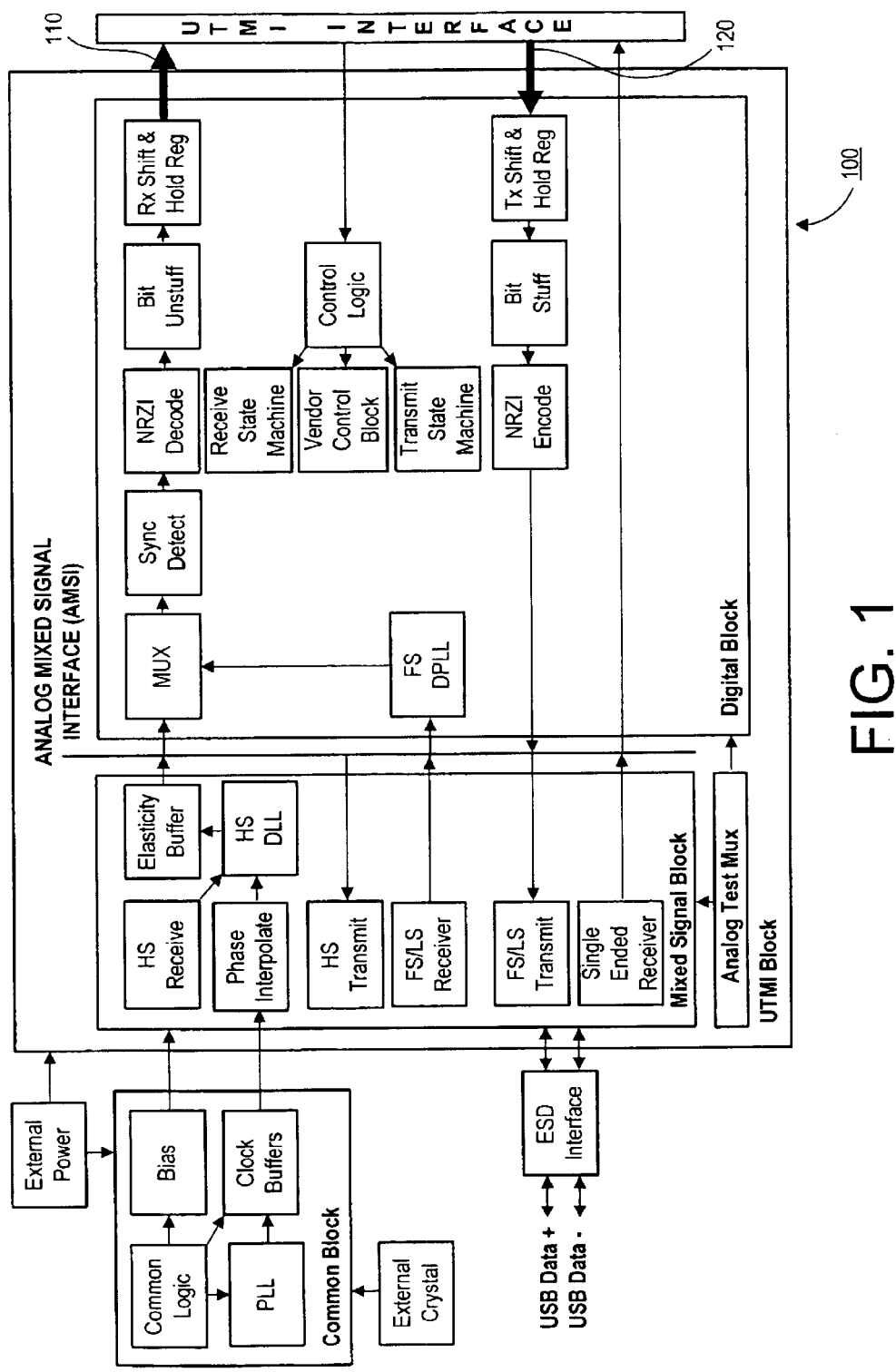
FIG. 1 is a block diagram of a portion of a USB 2.0 device in which bit-stuffing/unstuffing and Non-Zero-to-Return-Inverted (NRZI)-encoding/decoding are implemented.

FIG. 1 is a block diagram of a portion of a USB 2.0 device in which bit-stuffing/unstuffing and NRZI-encoding/decoding may be implemented. Path 110 is the path followed data received in portion 100 from a peripheral or other device and path 120 is the path of data to be transmitted by the USB 2.0 device.

Figure 2:
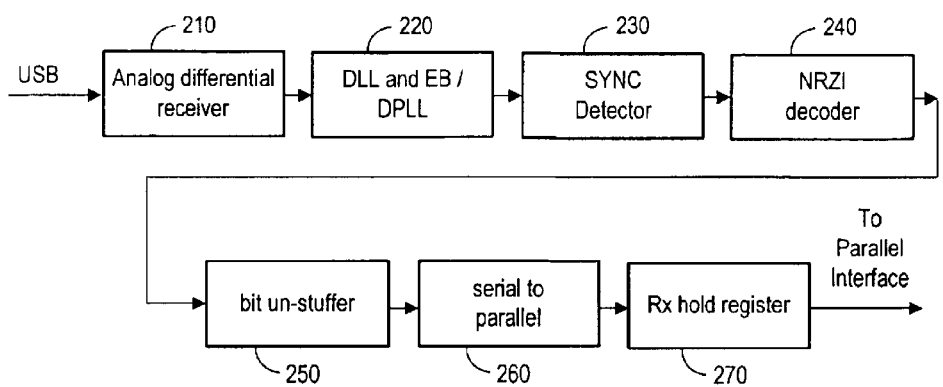
FIG. 2 is a block diagram showing a flow of data received in the portion of the USB 2.0 device shown in FIG. 1.

FIG. 2 is a block diagram showing a flow of data received from a host along path 110 in the portion of the USB 2.0 device shown in FIG. 1. During reception of USB data, Dial Pulse (DP) and Delta Modulation (DM) signals are passed through a differential receiver 210 to produce a single-ended bit stream that is passed through DLL and Elasticity Buffer to Digital Phase-Locked Loop (DPLL) 220 depending on the speed mode, to extract clock and data information. Dynamic Link Library (DLL)-Elasticity Buffer/DPLL block 220 provides synchronization between a recovered clock and a local clock. In this block, the data rate is changed from a relatively high overall system data rate (for example, 480 Mbit/sec. used in USB 2.0 devices) to a lower local clock rate for parallel processing. Modules 230–270 operate at the same local clock rate. Synchronization (SYNC) detector 230 detects and filters a SYNC pattern. Data leaving SYNC detector 230 is passed through an NRZI decoder block 240. NRZI-decoded data is sent to bit unstuffer 250, which strips off extra 0's inserted by a transmitting device. Serial data is converted to parallel data in block 260 and loaded into _hold_register 270 for delivery to a Universal Transceiver Macrocell Interface (UTMI) Parallel Receive Port.

Figure 3:
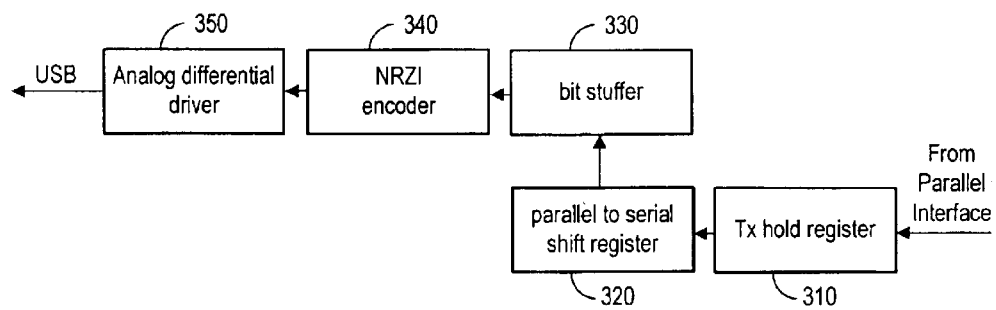
FIG. 3 is a block diagram showing a flow of data to be transmitted from the portion of the USB 2.0 device shown in FIG. 1.

FIG. 3 is a block diagram showing a flow of data along path 120 shown in FIG. 1, where the data is to be transmitted to a host from the portion of the USB 2.0 device shown in FIG. 1. parallel data is loaded into hold-register 310 at a UTMI Parallel Transmit Port. Parallel data is serialized in shift register 320. Bit stuffer 330 inserts transition bits into the serial data stream and passes the clock-recoverable data to NRZI encoder 340. NRZI encoded data proceeds from encoder 340 to analog differential driver 350 where the data is transmitted to a host.

Figure 4:
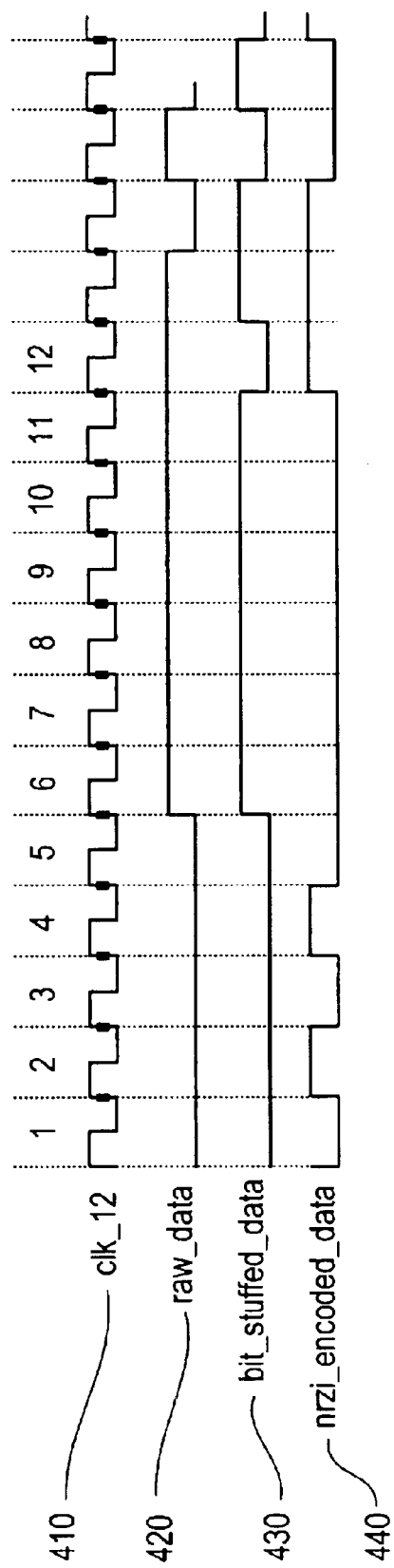
FIG. 4 is a timing diagram showing the relationship between a raw data stream, a corresponding bit-stuffed data stream corresponding to the raw data stream and an NRZI-encoded data stream corresponding to the bit-stuffed data stream.

FIG. 4 is a timing diagram showing the relationship between a raw data stream, a corresponding bit-stuffed data stream corresponding to the raw data stream and an NRZI-encoded data stream corresponding to the bit-stuffed data stream. FIG. 4 shows a raw data stream 420 transmitted in accordance with clock cycles 410. FIG. 4 also shows a bit-stuffed version 530 of raw data stream 420 and an NRZI-encoded version 440 of bit-stuffed data stream 430. As is known in the art, in NRZI-encoded data a 1-bit is represented by a constant voltage level and a 0-bit is represented by a change in voltage level. Thus, during a string of 0-bits the voltage level will change each clock cycle, and during a string of 1-bits the voltage level will remain constant.

Referring to FIG. 4, For bit-stuffed data 430, it can be seen that after 11 clock cycles the data value for bit-stuffed data becomes "0" after the occurrence of six consecutive 1-bits in raw data 420. This illustrates the addition of a 0-bit after six consecutive 1-bits, which is characteristic of bit-stuffed data. It may also be seen from FIG. 4 that the bit values of the NRZI-encoded data bits remains constant for clock cycles 6–11, consistent with the string of 1-bits occurring in bit-stuffed data 430. As seen in the graph of NRZI-encoded data 440, the bit values of the NRZI-encoded data in clock cycles 1–5 change with each clock cycle consistent with the occurrence of a string of 0-bits in the corresponding bit-stuffed data 430. Also, as seen in clock cycle 12, the 0-bit added to raw data 420 after the occurrence of six consecutive 1-bits in the raw data causes a voltage change in the corresponding NRZI-encoded data.

Generally, embodiments of the data processing device described herein are provided with a first data storage element having first and second memory registers which include a predetermined number N of memory addresses for receiving N data bits therein based on reception of a local clock signal from a local clock. In addition, these embodiments are provided with a processing circuit having either N multiplexers or N logic blocks which receive data bits from selected memory addresses in the first data storage element and which generate, in parallel, N data bits for output to an additional memory register or other group of memory addresses. The value of N is the number of data bits that will be received for parallel processing and also the number of data bits that will be generated as output by the processing circuit. The value of N is a function of a local clock rate L at which it is desired to parallel process the data bits in the data processing device described herein, and is determined by the relation N=S/L, where S= a clock rate of the overall system into which the data processing device is incorporated. Thus, for a given overall system clock rate S, a selected clock rate L at which parallel processing of the data is to occur can be achieved by selecting an appropriate value of N. For example, in a data processing system operating at a clock rate of 480 Mbit/sec., bit-stuffing/unstuffing and NRZI-encoding/decoding can be implemented at a local clock rate of 240 Mbit/sec. by specifying a number N of bits to be received for parallel processing, where N=480/240=2 bit.

Figure 5:
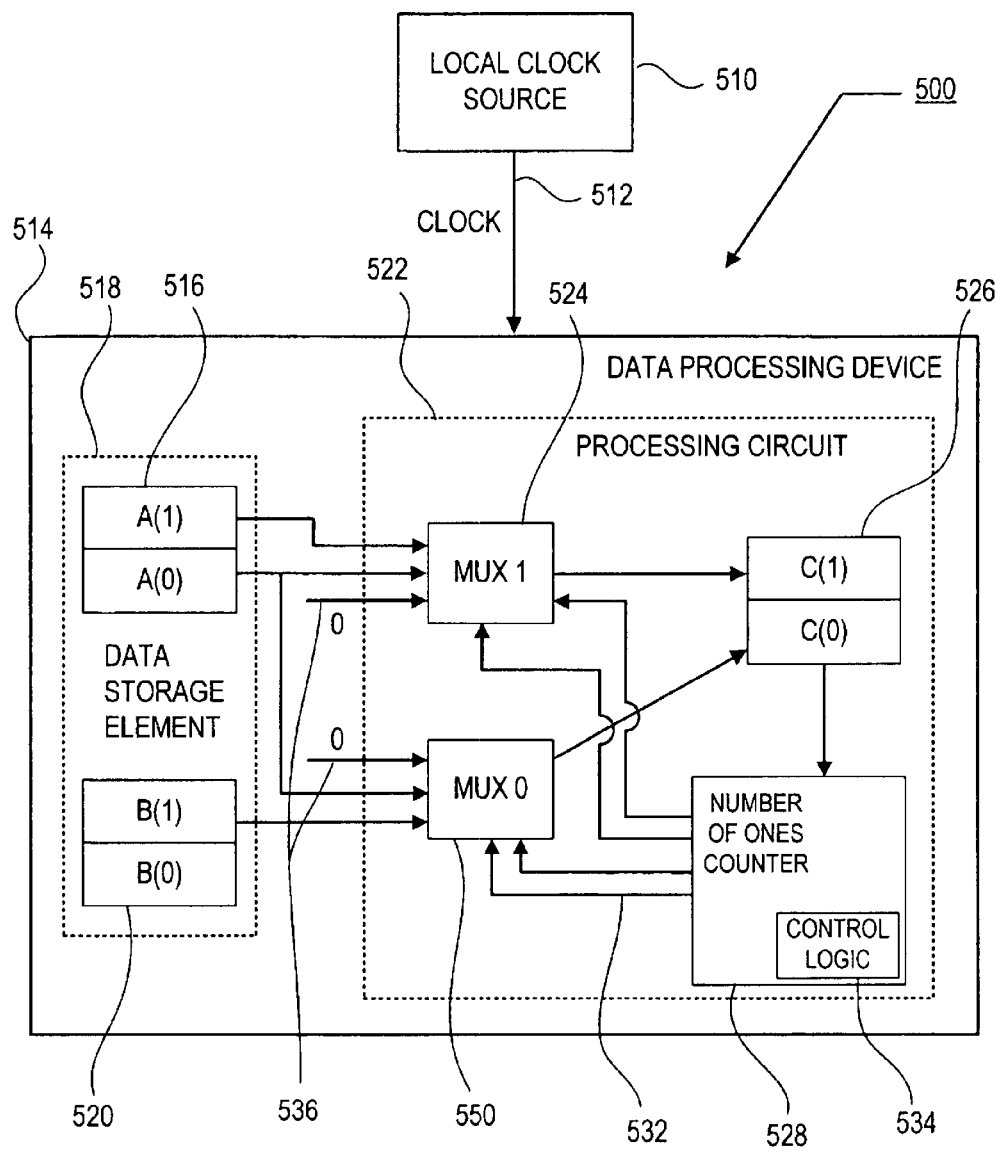
FIG. 5 is an example of a data processing device configured to parallel process raw data for use in generating two bits of bit-stuffed data.

A device 500 in one example is shown in FIG. 5. Device 500 has a data processing device 514 for parallel processing bits in a raw data stream to implement a bit-stuffing operation on the data and a local clock 510 operating at a local clock rate L to provide a timing signal 512 to data processing device 514. Device 500 is configured for processing 2-bit parallel data.

Bit-stuffing may involve selectively inserting a 0-bit after a certain number, such as six, consecutive 1-bits of data. It will be appreciated that frames of data may be delimited by a special bit pattern (usually 0111 1110). If this bit pattern is to be readily identified as a delimiter, the same bit pattern cannot be used within the actual data. Thus, to avoid confusion, a rule is established that for transmission of data a 0-bit is added after any six consecutive 1-bits. This 0-bit is then extracted and discarded at the receiving end by a computer using the same rule in reverse.

Data processing device 514 comprises a first data storage element 518 and a processing circuit 522 coupled to first data storage element 518. First data storage element 518 comprises first memory addresses which, in this embodiment, are incorporated into a first memory register 516 and a second memory register 520. First data storage element 518 is used to receive and store raw data bits prior to bit-stuffing. As the device shown is configured for processing 2-bit parallel data, N=2 and first memory register 516 has two memory addresses, A(1) and A(0). Second memory register 520 has two memory addresses, B(1) and B(0). In combination, memory addresses A(1), A(0), B(1) and B(0) comprise, in this example, the first memory addresses.

Processing circuit 522 of this embodiment includes a pair of multiplexers 524, 530 coupled to memory registers 516 and 520, a third memory register 526, coupled to multiplexers 524 and 530, a counting circuit 528 coupled to multiplexers 524 and 530, and a control logic unit 534 coupled to or incorporated into counting circuit 528.

Multiplexers 524 and 530 receive data bits from selected memory addresses in memory registers 516 and 520. A 0-bit input 536 is provided to each multiplexer for inserting 0-bits into the data in response to a control signal 532 generated by control logic unit 534. As shown, the presently described embodiment includes two multiplexers. In alternative embodiments, and as will be shown later, additional multiplexers are selectively included in the processing circuit depending on the desired local clock rate L at which data is to be parallel processed. Third memory register 526 includes a second plurality of memory addresses C (1) and C (0) which receive bit-stuffed data from multiplexers 524 and 530.

In this embodiment, counting circuit 528 is a number-of-ones counter which counts the consecutive occurrences of a predetermined data value (in this embodiment, 1-bits) occurring in third register 526. As data bits in third memory register 526 are output through counting circuit 528, the counting circuit counts the consecutive occurrences of 1-bits in the data from third memory register 526. Control logic unit 534 generates control signal 532, 540 to multiplexers 524 and 530. Control signals 532, 540 determine the point at which a 0-bit is to be inserted in the received data, based on the consecutive occurrences of 1-bits counted by counting circuit 528. Control logic unit 534 may be incorporated into counting circuit 528.

Data processing device 514 may include another plurality of memory addresses (not shown) that receive bit-stuffed data from multiplexers 524 and 530. The other memory addresses may be incorporated into first data storage element, or the other memory addresses may be incorporated into a second data storage element either internal or external to data processing device 514.

Figure 7:
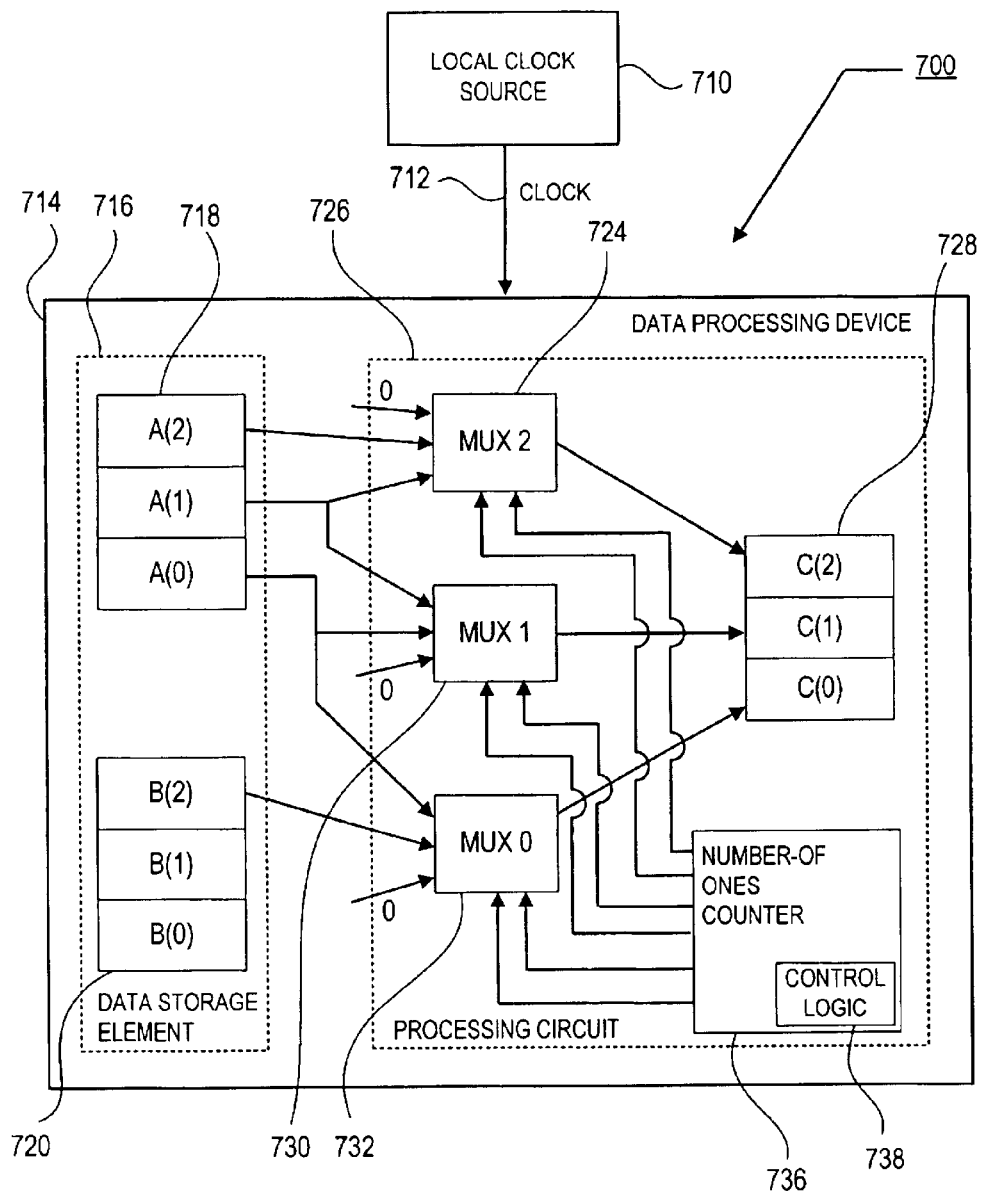
FIG. 7 is an example of a data processing device configured to parallel process raw data for use in generating three bits of bit-stuffed data.

FIG. 7 is a block diagram which illustrates how the data processing device (described in FIG. 5) may be expanded for processing an increased number of data bits in parallel in accordance with a desired local clock rate L. In a manner similar to FIG. 5, FIG. 7 shows a data processing device 714 having a first data storage element 716 and a processing circuit 726. First data storage element 716 has a first and second memory registers 718 and 720, respectively. Local clock source 710 provides a local clock signal 712 to first data storage element 716 and a processing circuit 726 which initiates reception, copying and movement of data bits within data processing device 714. Data processing device 714 also includes a counting circuit 736.

Memory register 718 is provided with memory addresses A(0)–A(2) for receiving a total of N=3 data bits. Processing circuit 726 is also provided with N multiplexers which receive data bits in parallel from selected memory addresses in first data storage element 718 and process the received data bits in parallel to generate N bits of bit-stuffed data. The additional multiplexers added to data processing device 714 also incorporate 0-bit inputs for inserting 0-bits into the data in response to control signal 734 generated by control logic unit 738.

Referring to FIG. 7, the following describes the data flow from selected memory addresses in the first plurality of memory addresses to multiplexers 724, 730, 732 in processing circuit 726, where N is the number of data bits received into first memory register 718 and x is a memory address identifier having integer values between 0 and (N−1).

|  | INPUT | TO MUX | OUTPUT TO |
|---|---|---|---|
| For x = 0 | A(x), B(N − 1) | x | C(x) |
| For N > x > 0 | A(x), A(x − 1) | x | C(x) |

Applying this algorithm to the data processing device shown in FIG. 7 where N=3 bits received in first memory register 718, for x=0, bits in addresses A(0) and B(2) are sent to MUX 0 732 and the value generated by MUX 0 732 is output to address C(0) in memory register 728. For x=1, bits in addresses A(1) and A(0) are sent to MUX 1 730 and the value generated by MUX 1 730 is output to address C(1). For x=2, bits in addresses A(2) and A(1) are sent to MUX 2 724 and the value generated by MUX 2 724 is output to address C(2).

Figure 6:
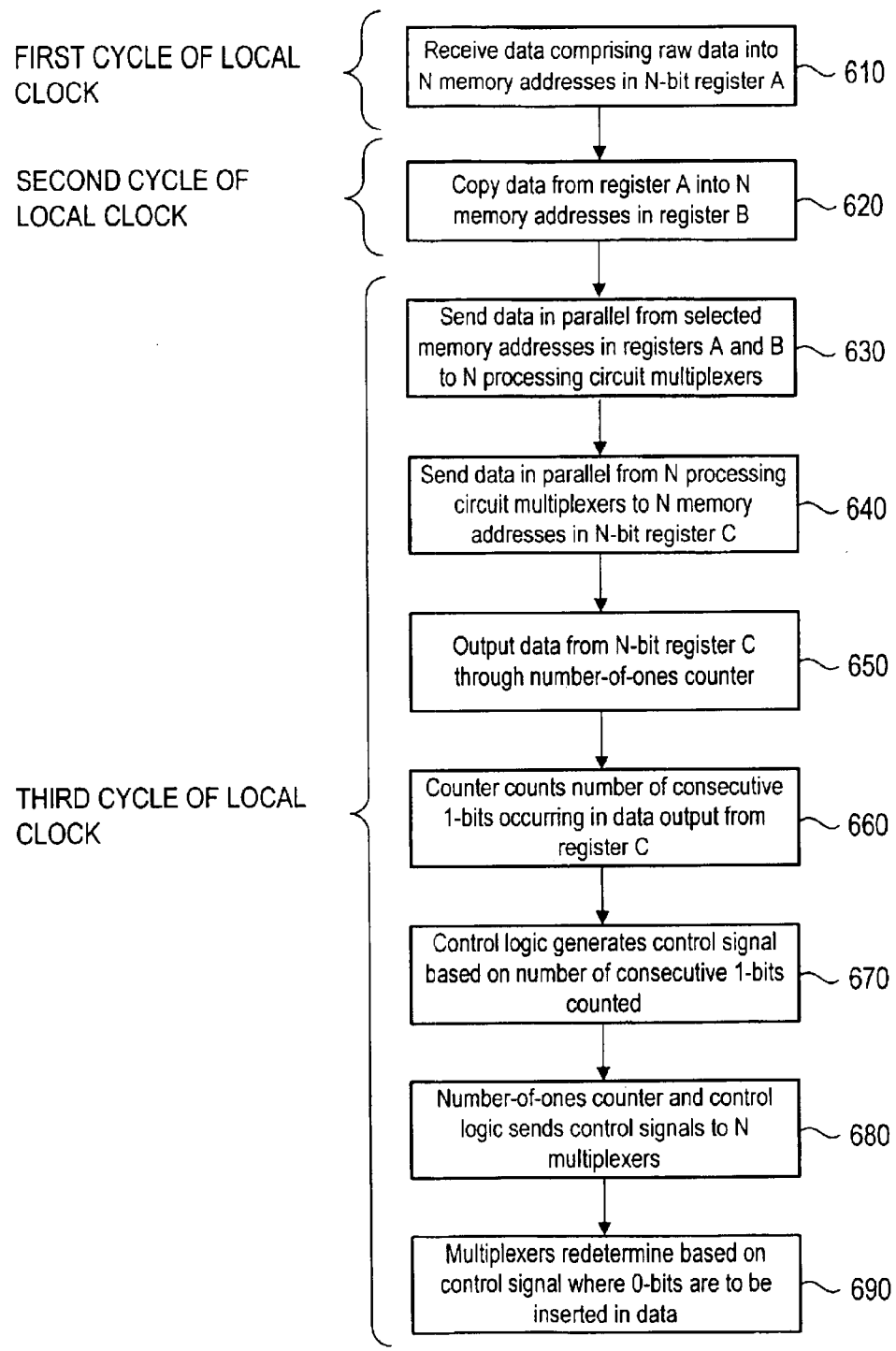
FIG. 6 is a flowchart illustrating the steps of implementing a bit-stuffing operation using the device of FIG. 5.

FIG. 6 illustrates the steps in accordance with a data processing device for parallel processing raw data to implement a bit-stuffing operation on the data. Referring to FIG. 6, in conjunction with FIG. 5, in step 610, data comprising raw data is received into N memory addresses in N-bit register 518 based on reception of a first local clock signal from local clock 510. In step 620, data received in memory addresses A(1) and A(0) is copied to memory addresses B(1) and B(0) in memory register 520 based on reception of a second local clock signal from local clock 510. The following steps occur based upon reception of a third local clock signal from local clock 510. In step 630, raw data is sent in parallel from selected memory addresses in memory registers 516 and 520 to multiplexers 524 and 530. In step 640, data is sent in parallel from processing circuit multiplexers 524 and 530 to N memory addresses in N-bit register 526. In step 650, data is outputted from N-bit register 526 through number-of-ones counter 528. In step 660, counting circuit 528 counts the number of consecutive 1-bits occurring in data output from register 526. In step 670, control logic unit 534 generates a control signal 532 based on the number of consecutive 1-bits counted by counting circuit 528. In step 680, control signal 532 is sent to multiplexers 524 and 530. In step 690, control signal 532 directs that a 0-bit be added to data entering the multiplexers from first data storage element 518, based on the number of consecutive 1-bits counted by counting circuit 528. Specifically, a 0-bit will be added to the data sent to multiplexers 524 and 530 when six consecutive 1-bits have been output through counting circuit 528. The resulting bit-stuffed data may then be sent to memory register 526.

Figure 8A:
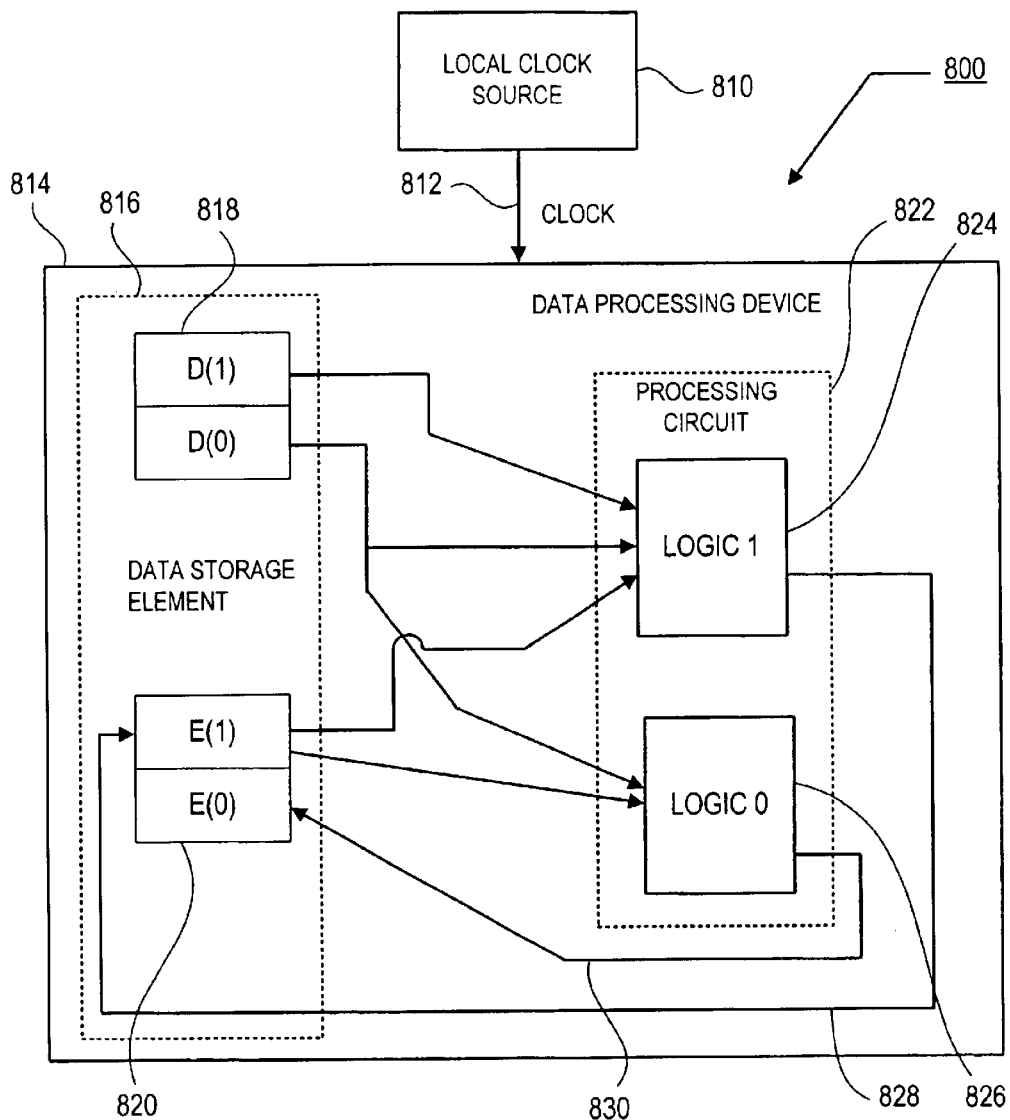
FIG. 8A is an example of a data processing device configured to parallel process raw data or bit-stuffed data for use in generating two bits of NRZI (Non-Return-to-Zero-Inverted) encoded data.

Referring now to FIG. 8A, device 800 shows a data processing device 814 used in parallel processing uncoded data, such as raw or bit-stuffed data, to implement a Non-Return-to-Zero-Inverted (NRZI)-encoding operation on the data. The device shown is configured for processing 2-bit parallel data. As is known in the art, NRZI involves transmitting and recording data such that the sending and receiving clocks remain synchronized. This may be utilized in situations where bit-stuffing is employed.

Data processing device 814 comprises a first data storage element 816 and a processing circuit 822 coupled to first data storage element 816. First data storage element 816 comprises a first plurality of memory addresses which are incorporated into a first memory register 818 and a second memory register 820. First data storage element 816 is used to receive and store raw or bit-stuffed data prior to NRZI-encoding. Device 800 is configured for processing 2-bit parallel data; thus, N=2 and first memory register 818 has two memory addresses, D(1) and D(0). Second memory register 820 has two memory addresses, E(1) and E(0). In combination, memory addresses D(1), D(0), E(1) and E(0) comprise the first memory addresses.

First memory register 818 is provided with two memory addresses D(0) and D(1). Processing circuit 822 of the presently described embodiment includes a pair of logic blocks 824, 826 coupled to memory registers 818 and 820 and having a plurality of exclusive-NOR logic gates 840 (FIG. 8B) and 842, 844 (FIG. 8C). As shown, this embodiment includes two logic blocks. In alternative embodiments, and as will be shown later, additional logic blocks may be included in processing circuit 822 depending on the desired local clock rate L at which data is to be parallel processed. A local clock 810 operating at local clock rate L is also included to provide timing signals to data processing device 814.

Figure 8B:
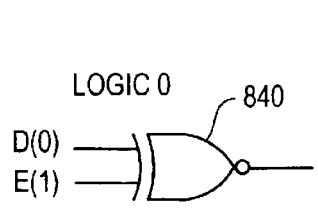
FIG. 8B is a schematic drawing of an exclusive-NOR logic gate included in one logic block incorporated into the data processing device of FIG. 8A.
Figure 8C:
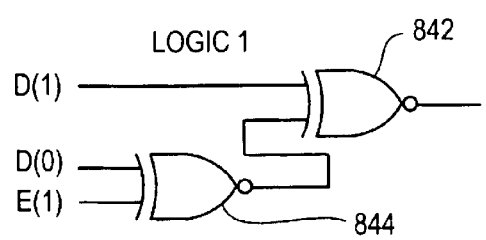
FIG. 8C is a schematic drawing of a combination of exclusive-NOR logic gates included in another logic block incorporated into the data processing device of FIG. 8A.

Operation of exclusive-NOR logic gates such as the one shown in FIG. 8B are well-known. If both input bits to the logic gate are 1-bits or if both input bits are 0-bits, the output of the logic gate will be a 1. However, if one input to the logic gate is a 0-bit while the other input is a 1-bit, the output of the logic gate will be a 0. Generally, appropriate combinations of exclusive-NOR logic gates may be formulated into logic blocks and appropriate ones of data bits in a data stream comprising raw or bit-stuffed data may be applied to the logic blocks to generate NRZI-encoded data or NRZI-decoded data.

Referring to FIGS. 8A–8C, in this embodiment exclusive-NOR logic gate 840 shown in FIG. 8B is representative of LOGIC 0 826, and the combination of exclusive-NOR logic gates 842 and 844 shown in FIG. 8C is representative of LOGIC 1 824.

As seen in FIGS. 8A and 8B, LOGIC 0 826 has two inputs; the data bit stored in memory address D(0) in first memory register 818, and the bit stored in address E(1) in second memory register 820. An output of LOGIC 0 826 is directed to address E(0) in second memory register 820.

As seen in FIG. 8C, LOGIC 1 824 comprises two exclusive-NOR logic gates 842 and 844 coupled such that the output of logic gate 844 serves as one input to logic gate 842. As seen in FIGS. 8A and 8C, LOGIC 1 824 has three inputs; the data bit stored in memory address D(1) in first memory register 818, the bit stored in address D(0) in first memory register 818, and the bit stored in address E(1) in second memory register 820. Bits in addresses D(0) and E(1) are input to logic gate 844. An output from logic gate 844, along with the bit in address D(1), is input to logic gate 842. An output of logic gate 842 of LOGIC 1 824 is directed to address E(1) in second memory register 820.

Data processing device 814, FIG. 8A, may include other memory addresses that receive NRZI-encoded data from logic blocks 824 and 826. The other memory addresses may be incorporated into first data storage element 816, or the other plurality of memory addresses may be incorporated into a second data storage element either internal or external to data processing device 814.

Figure 10A:
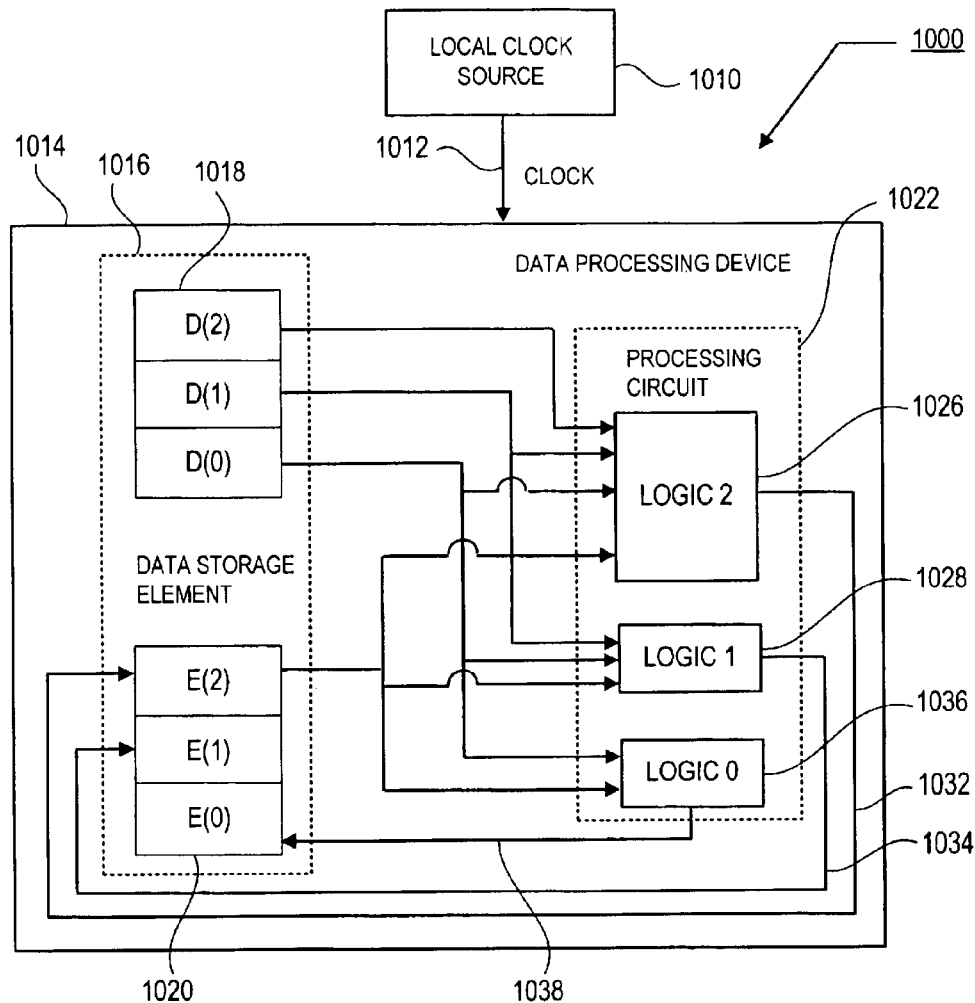
FIG. 10A is an example of a data processing device configured to parallel process raw data or bit-stuffed data for use in generating three bits of NRZI (Non-Return-to-Zero-Inverted) encoded data.

FIG. 10A is a block diagram of device 1000 which is an alternative embodiment of the device 800 of FIG. 8A, for processing an increased number of data bits in parallel in accordance with a desired local clock rate L. Device 1000 comprises a data processing device 1014 and a local clock source 1010 which provides a local clock signal 1012. Data processing device 1014 comprises a first data storage element 1016 and a processing circuit 1022. First data storage element 1016 has a first memory register 1018 and a second memory register 1020. Memory register 1018 is provided with memory addresses D(0)–D(2) for receiving a total of N=3 data bits. Processing circuit 1022 is also provided with 3 logic blocks LOGIC 0 1036, LOGIC 1 1028 and LOGIC 2 1026 which receive data bits in parallel from selected memory addresses in first data storage element 1016 and process the received data bits in parallel to generate three bits of NRZI-encoded data.

Figure 10B:
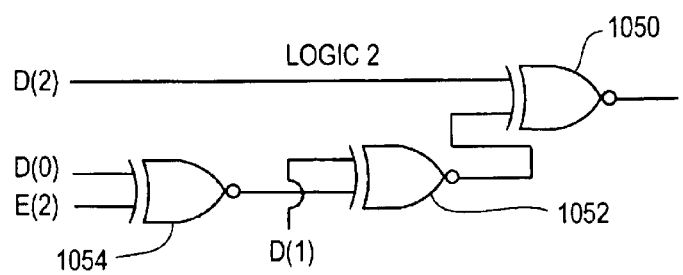
FIG. 10B is a schematic drawing of a combination of exclusive-NOR logic gates included in a logic block incorporated into the data processing device of FIG. 10A.

Referring to FIGS. 8B and 10A, in this embodiment exclusive-NOR logic gate 840 shown in FIG. 8B is representative of LOGIC 0 1036 in FIG. 10A, and the combination of exclusive-NOR logic gates 842 and 844 shown in FIG. 8C is representative of LOGIC 1 1028 in FIG. 10A. An output of LOGIC 0 1036 is directed to address E(0) in second memory register 1020. An output of LOGIC 1 1028 is directed to address E(1) in second memory register 1020. In addition, the combination of exclusive-NOR logic gates 1050, 1052 and 1054 shown in FIG. 10B is representative of LOGIC 2 1026 in FIG. 10A. As seen in FIG. 10B, LOGIC 2 1026 comprises three exclusive-NOR logic gates 1050, 1052 and 1054 coupled such that the output of logic gate 1054 serves as one input to logic gate 1052 and the output of logic gate 1052 serves as one input to logic gate 1050. As seen in FIGS. 10A and 10B, LOGIC 2 1026 has four inputs; the data bit stored in memory address D(1) in first memory register 1018, the bit stored in address D(0) in first memory register 1018, the bit stored in address E(2) in second memory register 1020 and the bit stored in address D(2) in first memory register 1018. For Logic 2 shown in FIG. 10B, bits in addresses D(0) and E(2) are input to logic gate 1054. An output from logic gate 1054, along with the bit in address D(1), is input to logic gate 1052. An output from logic gate 1052, along with the bit in address D(2), is input to logic gate 1050. An output of logic gate 1050 of LOGIC 2 1026 is directed to address E(2) in second memory register 1020.

Figure 17:
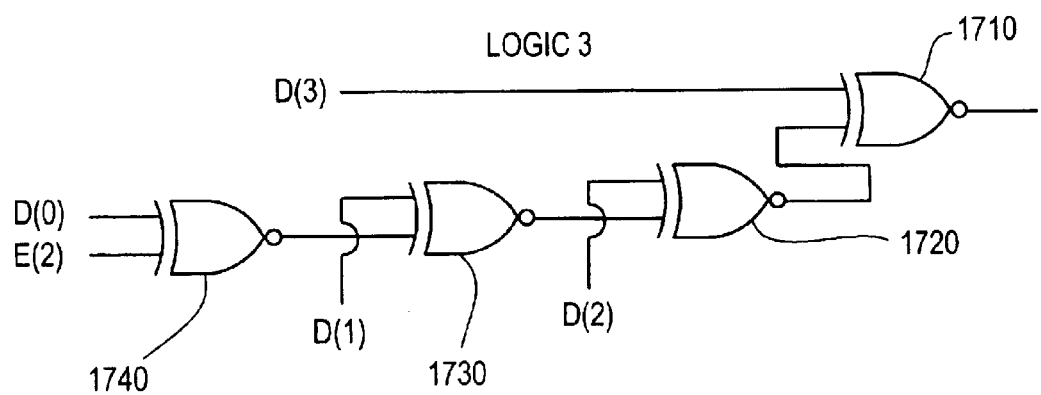
FIG. 17 is a schematic drawing of a combination of exclusive-NOR logic gates included in a logic block incorporated into the data processing device of FIG. 10A for use in generating four bits of NRZI (Non-Return-to-Zero-Inverted) encoded data.

FIG. 17 illustrates how the device of FIG. 10A for parallel processing data bits to generate NRZI-encoded data can be expanded for receiving and parallel processing an increased number of data bits. Specifically, FIG. 17 illustrates how the circuit in FIG. 10A may be expanded to provide a logic block to be incorporated into a processing circuit for N=4 received data bits. As may be seen from FIGS. 10A and 17, the circuit of FIG. 17 includes an additional exclusive-NOR logic gate 1740. The output of logic gate 1740 replaces memory address E(2) as one input to gate 1730. Memory address D(1) replaces memory address D(0) as another input to gate 1730. Memory address D(2) replaces memory address D(1) as an input to gate 1720. In addition, memory addresses D(0) and E(2) provide inputs to logic gate 1740. Also, memory address D(3) replaces memory address D(2) as one input to logic gate 1710. Thus, the resulting LOGIC 3 has a total of five inputs (D(3), D(2), D(1), D(0) and E(2)), rather than the four inputs of LOGIC 2. In a manner similar to the above, the circuit may be further expanded to provide logic blocks to accommodate any additional number of received data bits.

Figure 9:
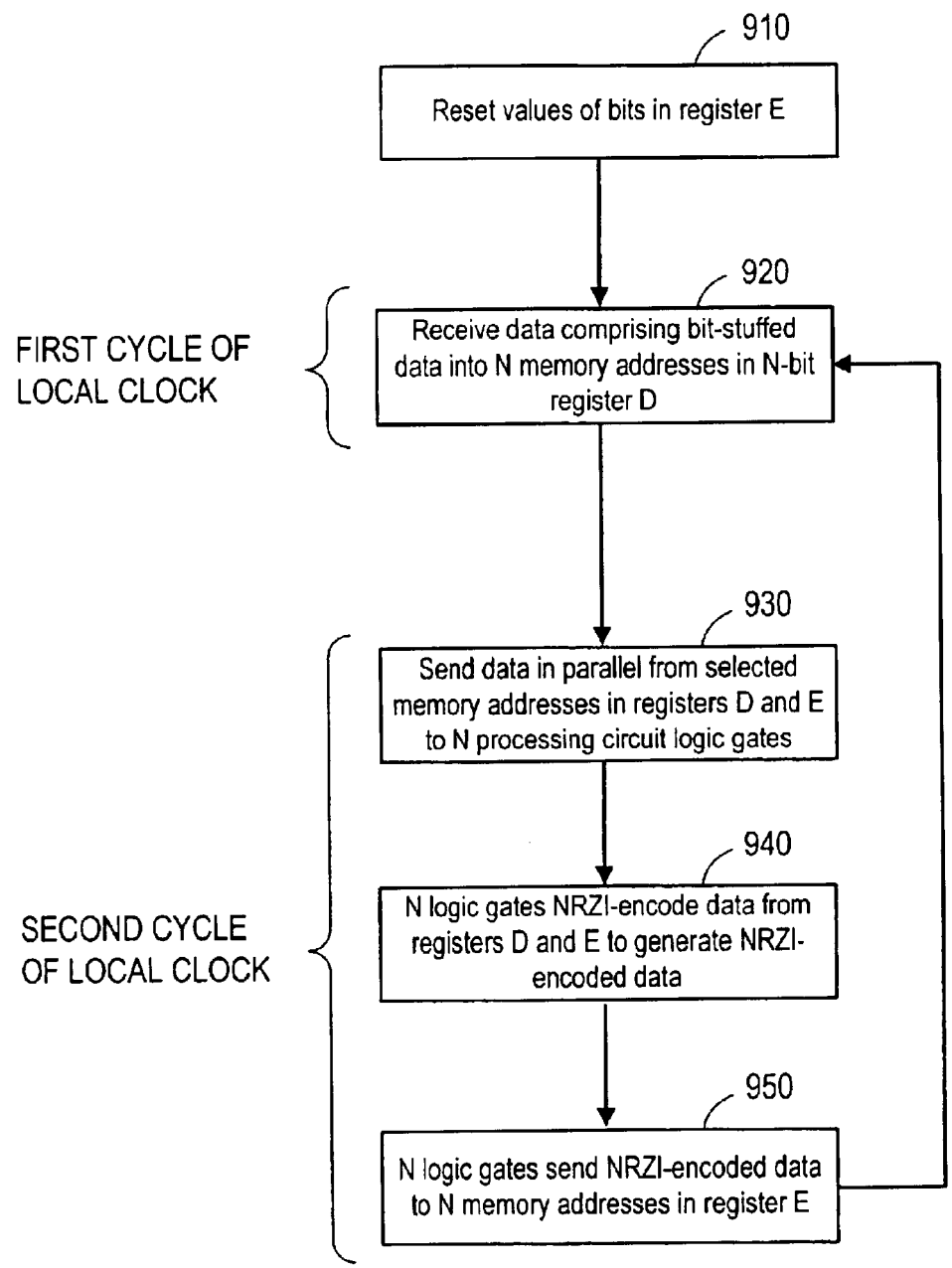
FIG. 9 is a flowchart illustrating the steps of implementing an NRZI-encoding operation using the device of FIG. 8A.

FIG. 9 illustrates the steps for parallel processing raw or bit-stuffed data to implement an NRZI-encoding operation on the data. The processing described, for example, in FIG. 9 may be implemented in conjunction with the device shown and described with reference to FIG. 8. In step 910, prior to receipt of first raw or bit-stuffed data bits in a data stream in register 818, the values of bits stored in memory addresses E(0) and E(1) of register 820 may be reset to a specific value (in the presently described embodiment, the values are set to 1). In step 920 data comprising raw or bit-stuffed data is received into memory addresses D(1) and D(0) in N-bit memory register 818 based upon reception of a first local clock signal from local clock 810. The following steps 930–950 occur based upon reception of a third local clock signal from local clock 810. In step 930 raw and/or bit-stuffed data is sent in parallel from selected memory addresses in registers 818 and 820 to processing circuit logic gates 824 and 826. In step 940, logic gates 824 and 826 then encode the received data to generate NRZI-encoded data. The NRZI-encoded data is then sent from logic gates 824 and 826 to N memory addresses in N-bit register 820 in step 950. One or more of the bits from logic gates 824 and 826, representing encoded data and stored in register 820, may be sent to logic gates 824 and 826 for use in encoding data bits newly received in register 818.

Figure 11A:
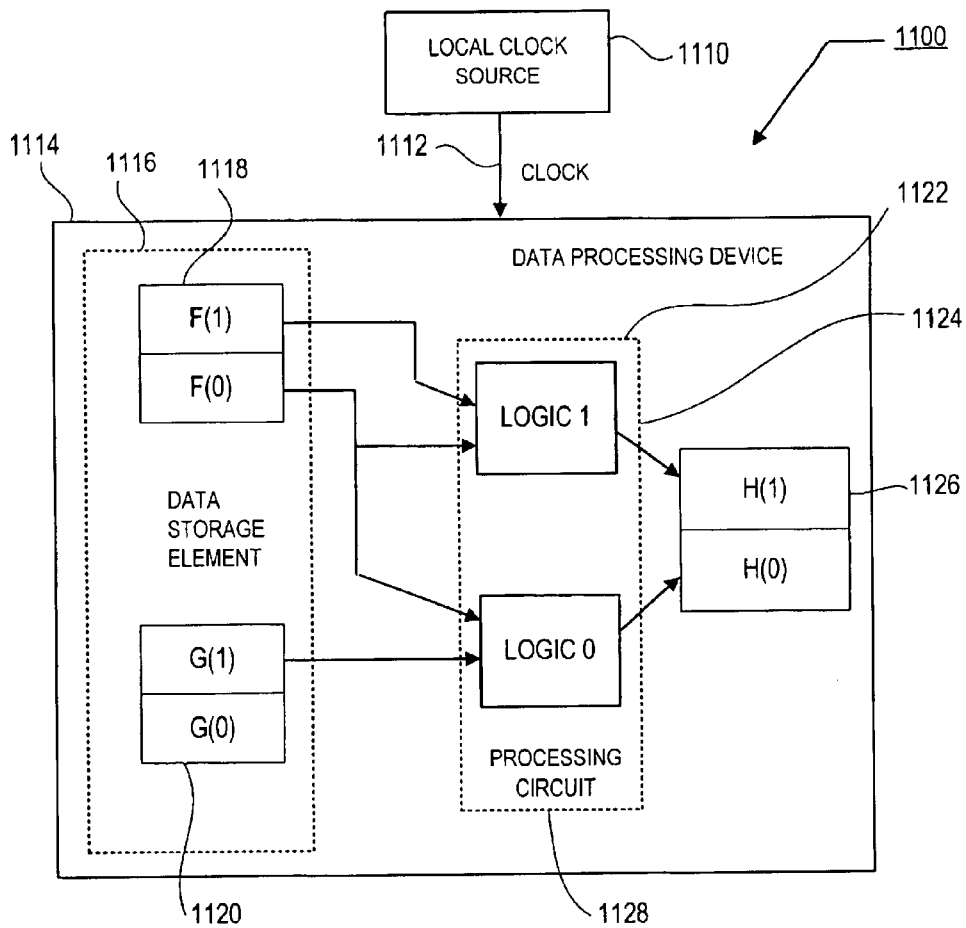
FIG. 11A is an example of a data processing device configured to parallel process NRZI-encoded data for use in generating two bits of NRZI-decoded data.

Referring to FIG. 11A, device 1100 is shown having a data processing device 1114 which performs parallel processing of NRZI-encoded data to implement an NRZI-decoding operation on the data. Device 1100 is configured for processing 2-bit parallel data. Data processing device 1114 comprises a first data storage element 1116 and a processing circuit 1122 coupled to the first data storage element. The first data storage element comprises first memory addresses which are incorporated into a first memory register 1118 and a second memory register 1120. First data storage element 1116 is used to receive and store NRZI-encoded data prior to NRZI-decoding. As seen in FIG. 11A, device 1100 is configured for processing 2-bit parallel data. First memory register 1118 is provided with two memory addresses, F(1) and F(0). Second memory register 1120 has two memory addresses, G(1) and G(0). In combination, memory addresses F(1), F(0), G(1) and G(0) comprise the first memory addresses. Processing circuit 1122 is shown with a pair of logic blocks 1124, 1128 coupled to memory registers 1118 and 1120, each block comprising an exclusive-NOR logic gate 1130 and 1132 (FIGS. 11B, 11C), respectively, and a third memory register 1126 (FIG. 11A), coupled to logic blocks 1124 and 1128.

Figure 11B:
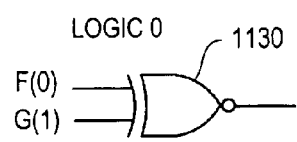
FIG. 11B is a schematic drawing of an exclusive-NOR logic gate included in one logic block incorporated into the data processing device of FIG. 11A.
Figure 11C:
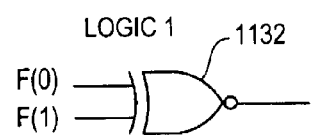
FIG. 11C is a schematic drawing of an exclusive-NOR logic gate included in another logic block incorporated into the data processing device of FIG. 11A.

Referring to FIGS. 11A–11C, in this embodiment exclusive-NOR logic gate 1130 shown in FIG. 11B is representative of LOGIC 0 1128 in FIG. 11A, and exclusive-NOR logic gate 1132 shown in FIG. 11C is representative of LOGIC 1 1240 in FIG. 11A. Exclusive-NOR logic gates 1130 and 1132 receive data bits from selected memory addresses in memory registers 1118 and 1120. As seen in FIG. 11B, LOGIC 0 1128 has two inputs; the data bit stored in memory address F(0) in first memory register 1118 and the bit stored in address G(1) in second memory register 1120. An output of LOGIC 0 1128 is directed to address H(0) in third memory register 1126. As seen in FIG. 11C, LOGIC 1 1124 has two inputs, the data bit stored in memory address F(0) in first memory register 1118 and the bit stored in address F(1) in first memory register 1118. An output of LOGIC 1 1124 is directed to address H(1) in third memory register 1126.

As shown, the presently described embodiment (of FIGS. 11A–11C) includes N=2 exclusive-NOR logic gates. In alternative embodiments, and as will be shown later, additional exclusive-NOR logic gates may be included in the processing circuit depending on the desired local clock rate L at which data is to be parallel processed. Third memory register 1126 includes a second plurality of memory addresses H(0), H(1) which receive NRZI-encoded data from exclusive-NOR logic gates 1130 and 1132. A local clock 1110 may also be included to provide a timing signal 1112 to first data storage element 1116 and processing circuit 1122.

Data processing device 1114 may include other memory addresses that receive raw or bit-stuffed data from exclusive-NOR logic gates 1130 and 1132. The other memory addresses may be incorporated into first data storage element 1116, or the other memory addresses may be incorporated into a second data storage element (not shown) either internal or external to data processing device 1114.

Figure 13A:
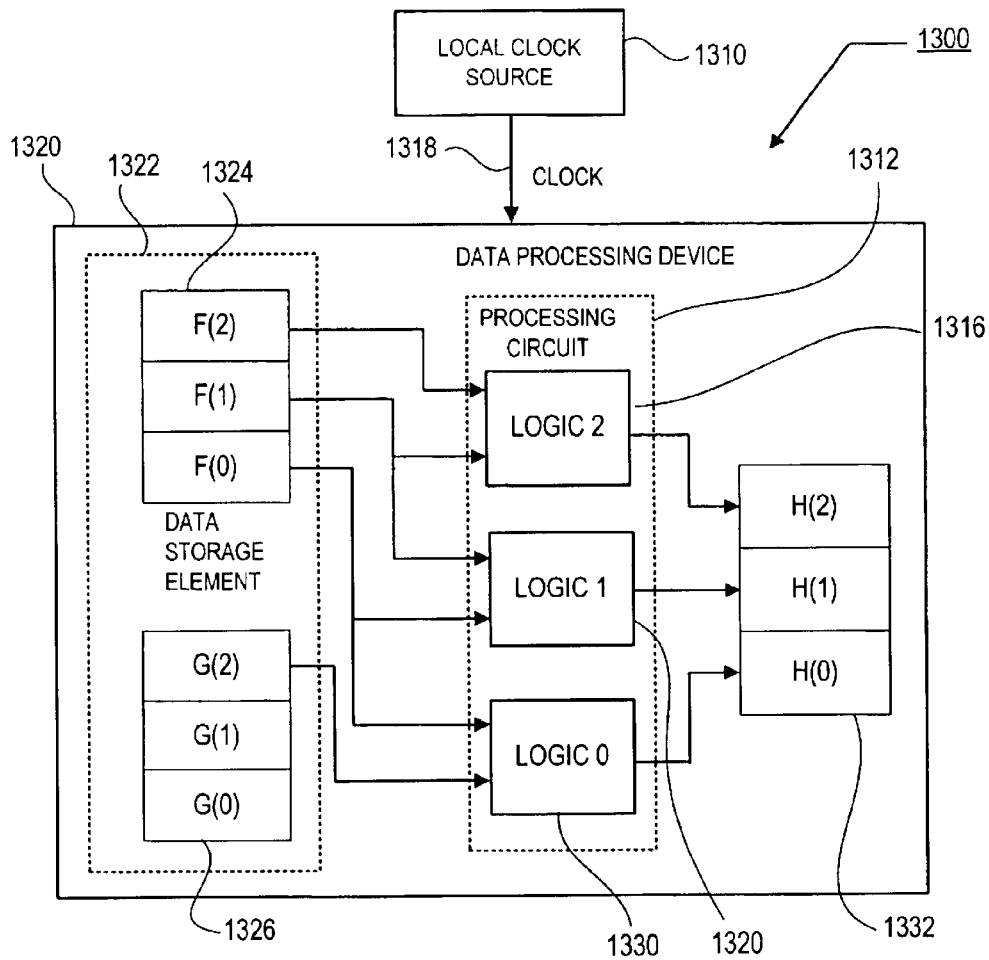
FIG. 13A is an example of a data processing device configured to parallel process NRZI-encoded data for use in generating three bits of NRZI-decoded data.

FIG. 13A is a block diagram which illustrates how a data processing device (such as data processing device 1114 of FIG. 11A) may be expanded for processing an increased number of data bits in parallel in accordance with a desired local clock rate L. Memory register 1324 is provided with memory addresses F(0)–F(2) for receiving a total of N=3 data bits. Processing circuit 1312 is also provided with N=3 logic blocks which receive data bits in parallel from selected memory addresses in first data storage element 1324 and process the received data bits in parallel to generate N=3 bits of NRZI-decoded data.

Figure 13B:
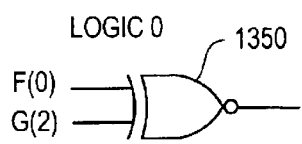
FIG. 13B is a schematic drawing of an exclusive-NOR logic gate included in a first logic block incorporated into the data processing device of FIG. 13A.
Figure 13C:
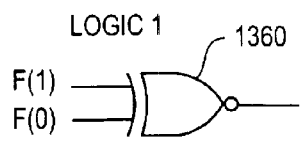
FIG. 13C is a schematic drawing of an exclusive-NOR logic gate included in a second logic block incorporated into the data processing device of FIG. 13A.
Figure 13D:
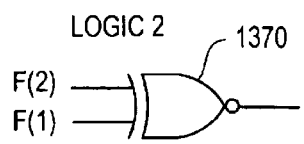
FIG. 13D is a schematic drawing of an exclusive-NOR logic gate included in a third logic block incorporated into the data processing device of FIG. 13A.

Referring to FIGS. 13B–13D, in this embodiment exclusive-NOR logic gate 1350 shown in FIG. 13B is representative of LOGIC 0 1330 in FIG. 13A, exclusive-NOR logic gate 1360 shown in FIG. 13C is representative of LOGIC 1 1320 in FIG. 13A, and exclusive-NOR logic gate 1370 shown in FIG. 13D is representative of LOGIC 2 1316 in FIG. 13A. As seen in FIG. 13A, LOGIC 0 1330 has two inputs; the data bit stored in memory address F(0) in first memory register 1324 and the bit stored in address G(2) in second memory register 1326. An output from LOGIC 0 1330 is sent to address H(0) in register 1332. As seen in FIG. 13A, LOGIC 1 1320 has two inputs; the data bit stored in memory address F(0) in first memory register 1324 and the bit stored in address F(1) in first memory register 1324. An output from LOGIC 1 1320 is sent to address H(1) in register 1332. As seen in FIG. 13A, LOGIC 2 1316 has two inputs; the data bit stored in memory address F(1) in first memory register 1324 and the bit stored in address F(2) in first memory register 1324. An output from LOGIC 2 1316 is sent to address H(2) in register 1332.

Referring again to FIG. 13A, the following describes the data flow from selected memory addresses in the first plurality of memory addresses to multiplexers 1316, 1340, 1330 in processing circuit 1312, where N is the number of data bits received into first memory register 1324 and x is a memory address identifier having integer values between 0 and (N−1).

|  | INPUT | TO LOGIC | OUTPUT TO |
| --- | --- | --- | --- |
| For x = 0 | F(x), G(N − 1) | x | H(x) |
| For N > x > 0 | F(x), F(x − 1) | x | H(x) |

Applying the above algorithm to the data processing device 1320 shown in FIG. 13 where N=3 bits received in first memory register 1324, for x=0, bits in addresses F(0) and G(2) are sent to LOGIC 0 and the value generated by LOGIC 0 is output to address H(0) in memory register 1332. For x=1, bits in addresses F(1) and F(0) are sent to LOGIC 1 and the value generated by LOGIC 1 is output to address H(1). For x=2, bits in addresses F(2) and F(1) are sent to LOGIC 2 and the value generated by LOGIC 2 is output to address H(2).

Figure 12:
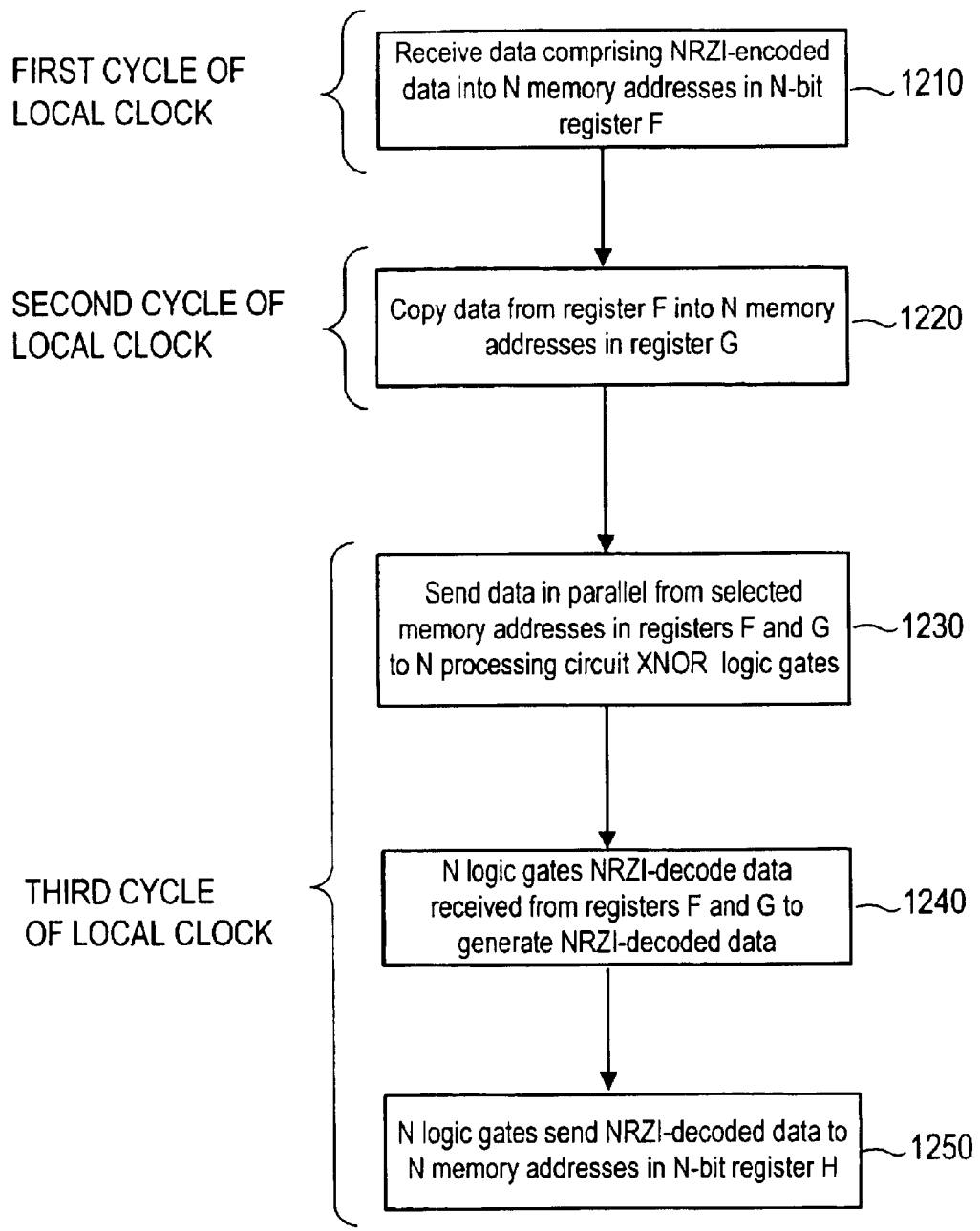
FIG. 12 is a flowchart illustrating the steps of implementing an NRZI-decoding operation using the device of FIG. 11A.

FIG. 12 is a flow diagram which illustrates one example of the steps of parallel processing NRZI-encoded data to implement an NRZI-decoding operation on the data. The processing described in FIG. 12 may be selectively implemented in a data processing device such as device 1114 of FIG. 11A. Referring again to FIG. 12, in conjunction with FIG. 11, in step 1210 data comprising NRZI-encoded data is received into memory addresses F(1) and F(0) in N-bit memory register 1118 based upon reception of a first local clock signal from local clock 1110. In step 1220, data received in memory addresses F(1) and F(0) is copied to memory addresses G(1) and G(0) in memory register 1120 based upon reception of a second local clock signal from local clock 1110. The following steps occur based upon reception of a third local clock signal from local clock 1110. In step 1230, NRZI-encoded data is sent in parallel from selected memory addresses in memory registers 1118 and 1120 to processing circuit logic blocks 1124 and 1128. In step 1240, logic blocks 1124 and 1128 decode the NRZI-encoded data sent from registers 1118 and 1120 to generate NRZI-decoded data. The NRZI-decoded data is sent to N memory addresses in N-bit register H in step 1250.

Figure 14:
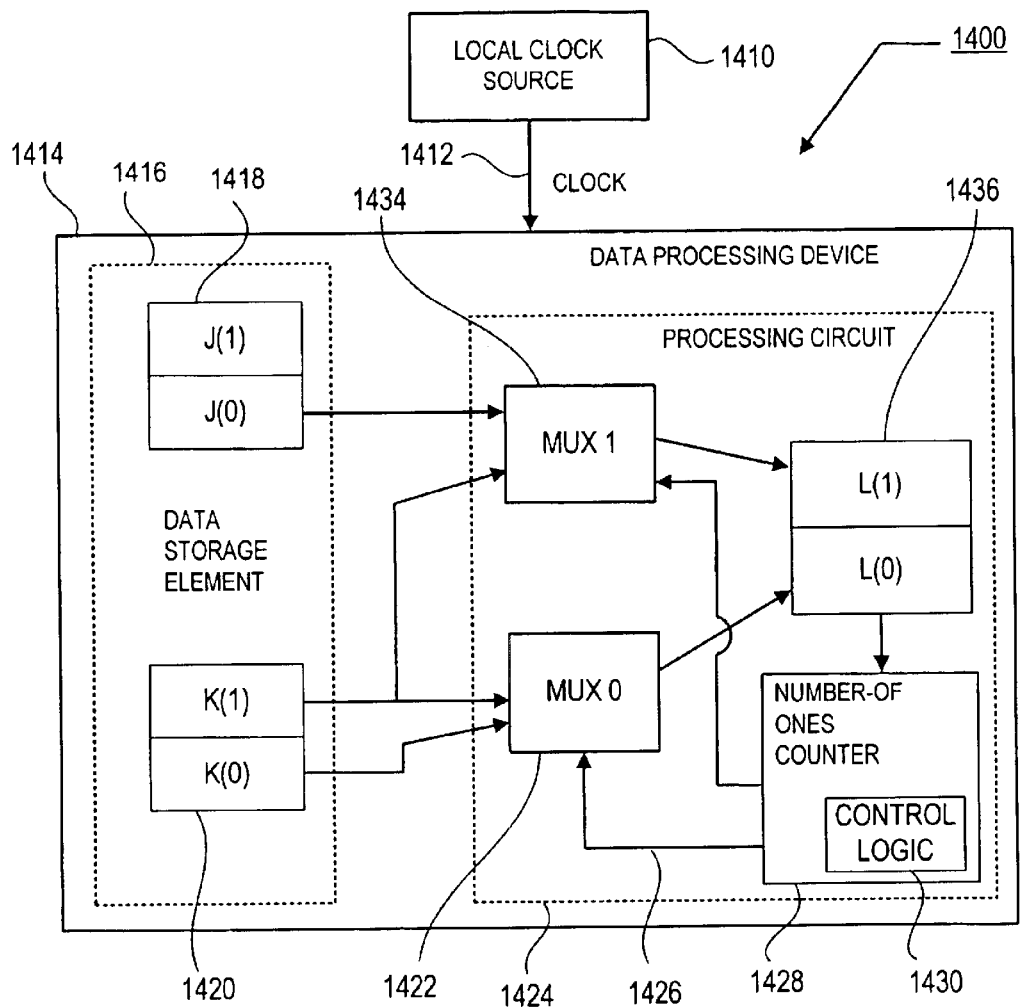
FIG. 14 is an example of a data processing device configured to parallel process bit-stuffed data for use in generating two bits of bit-unstuffed data.

FIG. 14 illustrates an example of a device 1400 having a data processing device 1414 for parallel processing bits in a bit-stuffed data stream to implement a bit-unstuffing operation on the data, thereby converting the data stream into raw data. Device 1400, as seen in FIG. 14, is configured for processing 2-bit parallel data. Data processing device 1414 comprises a first data storage element 1416 and a processing circuit 1432 coupled to first data storage element 1416. First data storage element 1416 comprises a first plurality of memory addresses which are incorporated into a first memory register 1418 and a second memory register 1420. First data storage element 1416 receives and stores raw data bits prior to bit-unstuffing.

As the data processing device 1414 is configured for processing 2-bit parallel data, first memory register 1418 is provided with two memory addresses J(0) and J(1). Processing circuit 1432 includes a pair of multiplexers 1434, 1422 coupled to memory registers 1418 and 1420, a third memory register 1436, coupled to multiplexers 1434 and 1422, a counting circuit 1428 coupled to multiplexers 1422 and 1434 and third memory register 1436, and a control logic unit 1430 coupled to or incorporated into counting circuit 1428.

Multiplexers 1434 and 1422 receive data bits from selected memory addresses in memory registers 1418 and 1420. The example shown in FIG. 14 has two multiplexers. In alternative embodiments, and as will be shown later, additional multiplexers may be included in the processing circuit depending on the desired local clock rate L at which data bits are to be processed in parallel. Third memory register 1436 includes a second plurality of memory addresses which receive bit-unstuffed (i.e., raw) data from multiplexers 1434 and 1422.

Counting circuit 1428 may selectively be a Number-Of-Ones counter which counts the consecutive occurrences of a predetermined data value (in this embodiment, 1-bits) occurring in third memory register 1436. As data bits in third memory register 1436 are output through counting circuit 1428, the counting circuit counts the consecutive occurrences of 1-bits in the data from third memory register 1436. Control logic unit 1430 generates a control signal 1426 to multiplexers 1422 and 1434 which determines the point at which a 0-bit is to be extracted from the received data, based on the consecutive occurrences of 1-bits counted by counting circuit 1428. Control logic unit 1430 may selectively be incorporated into counting circuit 1428. A local clock 1410 operating at a local clock rate L is also included to provide a timing signal 1412 to data processing device 1414.

Data processing device 1414 may include another plurality of memory addresses that receive raw data 1438 from output from the third memory register 1436. The other plurality of memory addresses may be incorporated into first data storage element 1416, or the other plurality of memory addresses may be incorporated into a second data storage element either internal or external to data processing device 1414.

Figure 16:
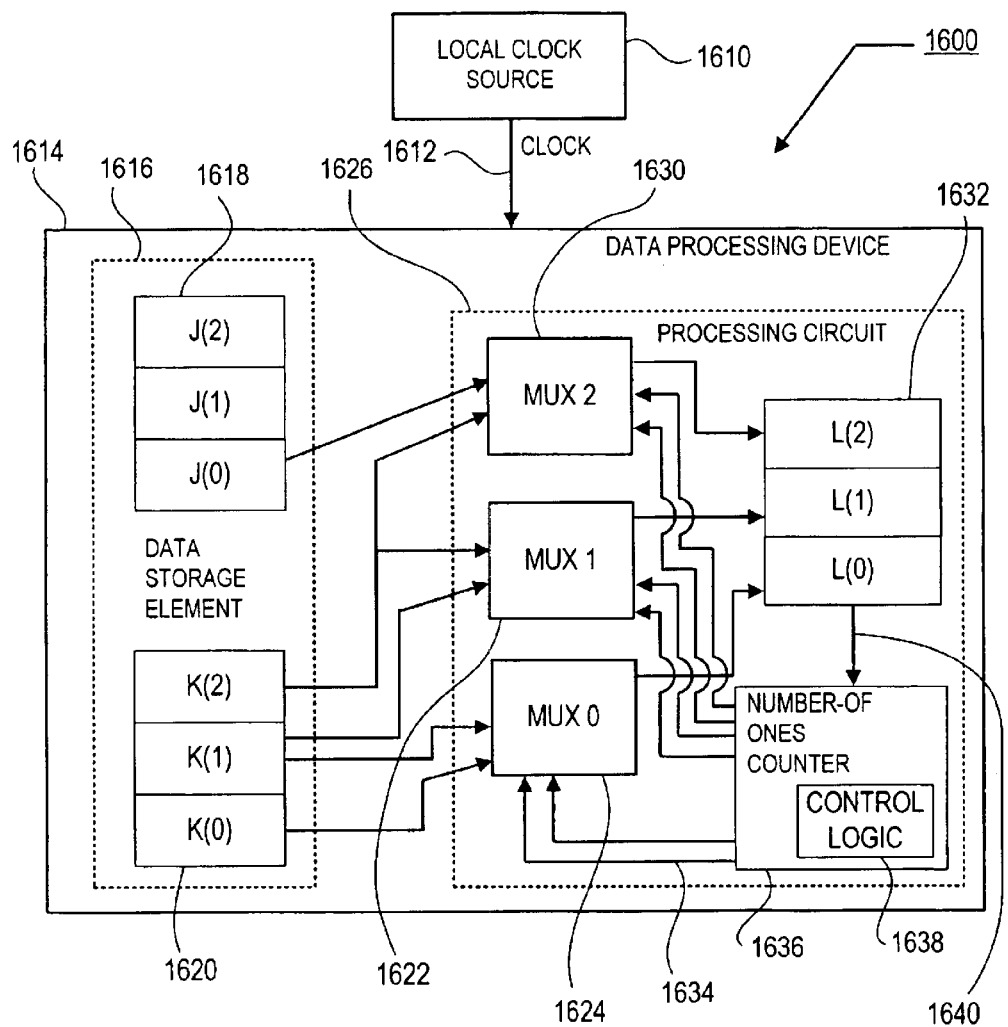
FIG. 16 is an example of a data processing device configured to parallel process bit-stuffed data for generating three bits of bit-unstuffed data.

FIG. 16 is a block diagram that illustrates how a data processing device (such as data processing device 1414 of FIG. 14) which processes a bit-stuffed data stream to implement a bit-unstuffing operation may be expanded for processing an increased number of data bits in parallel in accordance with a desired local clock rate L. Memory register 1618 is provided with memory addresses J(0)–J(2) for receiving a total of N=3 data bits. Processing circuit 1626 is also provided with N logic blocks which receive data bits in parallel from selected memory addresses in first data storage element 1618 and process the received data bits in parallel to generate N bits of raw data.

As seen in FIG. 16, memory register 1618 is provided with memory addresses J(0)–J(2) for receiving a total of N=3 data bits. Processing circuit 1626 is also provided with N=3 multiplexers 1622, 1624, 1630 which receive data bits in parallel from selected memory addresses in first data storage element 1616 and process the received data bits in parallel to generate N=3 bits of bit-stuffed data. The additional multiplexers added to data processing device 1614 also incorporate 0-bit inputs for inserting 0-bits into the data in response to control signal 1634 generated by control logic unit 1638 of counting circuit 1636.

The following describes the data flow from selected memory addresses in the first plurality of memory addresses to multiplexers 1622, 1624, 1630 in processing circuit 1626, where N is the number of data bits received into first memory register 1618 and x is a memory address identifier having integer values between 0 and (N−1).

| | INPUT | TO MUX | OUTPUT TO |
|---|---|---|---|
| For (N − 1) > x > = 0 | K(x), K(x + 1) | x | L(x) |
| For x = (N − 1) | K(x), J(0) | x | L(x) |

Applying the above algorithm to data processing device 1614 shown in FIG. 16 where N=3 bits received in first memory register 1618, for x=0, bits in addresses J(0) and K(1) are sent to MUX 0 and the value generated by MUX 0 is output to address L(0) in memory register 1632. For x=1, bits in addresses J(1) and J(0) are sent to MUX 1 and the value generated by MUX 1 is output to address L(1). For x=2, bits in addresses J(2) and J(1) are sent to MUX 2 and the value generated by MUX 2 is output to address L(2).

Figure 15:
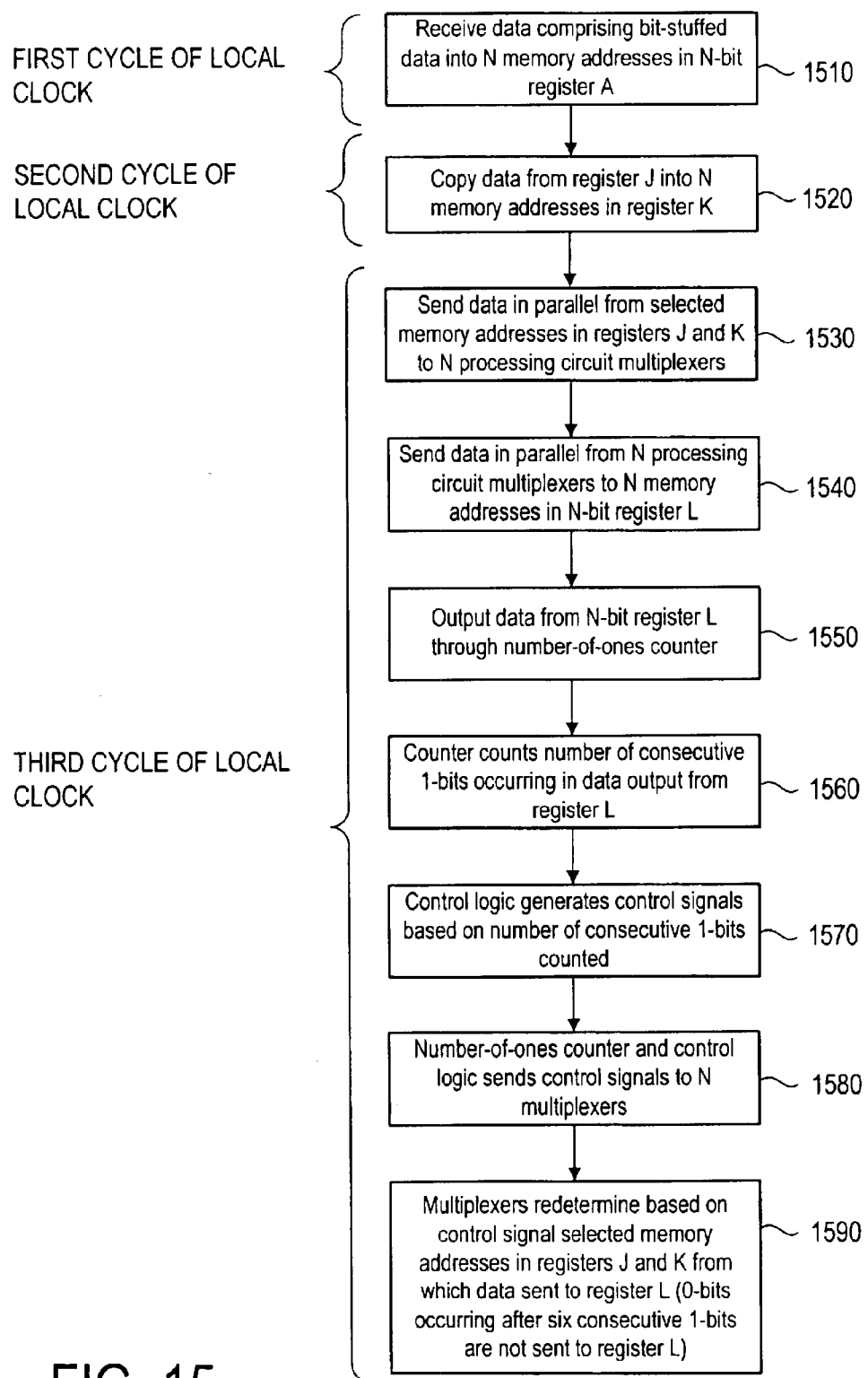
FIG. 15 is a flowchart illustrating the steps of implementing a bit-unstuffing operation using the device of FIG. 14.

FIG. 15 is a flow diagram describing the steps of one example of parallel processing bit-stuffed data to implement a bit-unstuffing operation on the data. Referring to FIG. 15, in conjunction with FIG. 14, in step 1510, bit-stuffed data is received into N memory addresses in N-bit register 1418 based on reception of a first local clock signal from local clock 1410. Steps 1520–1590 may selectively occur based upon reception of a second local clock signal from local clock 1410. In step 1520, data received in memory addresses J(1) and J(0) is copied to memory addresses K(1) and K(0) in memory register 1420. In step 1530, bit-stuffed data is sent in parallel from selected memory addresses in memory registers 1418 and 1420 to multiplexers 1422 and 1434. In step 1540, data is sent in parallel from processing circuit multiplexers 1434 and 1422 to N memory addresses in N-bit register 1436. In step 1560, counting circuit 1428 counts the number of consecutive 1-bits occurring in data output from register 1436. In step 1570, control logic unit 1430 generates a control signal 1426 based on the number of consecutive 1-bits counted by the counting circuit. In step 1580, control signal 1426 is sent to multiplexers 1422 and 1434. In step 1590, control signal 1426 asserts "next bit is stuffed" when bits previously output from register 1436 through counting circuit 1428 have been 1-bits for enough repeated clock cycles of local clock 1410 such that six consecutive 1-bits have passed through counting circuit 1428. When the "next bit is stuffed" signal is asserted, one stuffed bit has been received. When no stuffed bit is received, the data bit residing in memory address K(1) is copied to address L(1) and the data bit residing in memory address K(0) is copied to address L(0). When one stuffed bit 1410. Thus, in response to control signal 1412, multiplexers 1434 and 1422 redetermine the selected memory addresses in registers 1418 and 1420 from which data is sent to register 1436 such that 0-bits occurring after receipt of six consecutive 1-bits are not sent to register 1436 for output.

It should be understood that the preceding is merely a detailed description of one embodiment of this invention and that numerous changes to the disclosed embodiment can be made in accordance with the disclosure herein without departing from the spirit or scope of the invention. The preceding description, therefore, is not meant to limit the scope of the invention. Rather, the scope of the invention is to be determined only by the appended claims and their equivalents.

What is claimed is:

1. A data processing device that processes raw data bits in parallel to generate bit-stuffed data comprising:
   a first data storage element having a first plurality of memory addresses that stores the raw data; and
   a processing circuit coupled to the first data storage element that processes in parallel data bits sent from selected ones of the first plurality of memory addresses to generate bit-stuffed data,
   wherein the processing circuit comprises:
       a plurality of multiplexers that are coupled to the first plurality of memory addresses and which receive data bits from the selected ones of the first plurality of memory addresses,
       a second plurality of memory addresses that are coupled to the plurality of multiplexers and receive bit-stuffed data from the plurality of multiplexers,
       a counting circuit unit that is coupled to the plurality of multiplexers and the second plurality of memory addresses and which counts the occurrences of a predetermined data value in the second plurality of memory addresses, and
       a control logic unit that provides a control signal to the plurality of multiplexers based on the counted occurrences of the predetermined data value.

2. The data processing device according to claim 1 wherein the first plurality of memory addresses is incorporated into a plurality of memory registers.

3. The data processing device according to claim 2 wherein the first plurality of memory registers comprises a first memory register and a second memory register.

4. The data processing device according to claim 3 wherein the first memory register has a predetermined number N of memory addresses.

5. The data processing device according to claim 1 wherein the first data storage element includes another plurality of memory addresses that receive the bit-stuffed data.

6. The data processing device according to claim 1 further comprising a second data storage element having another plurality of memory addresses that receive the bit-stuffed data.

7. The data processing device according to claim 6 wherein the other plurality of memory addresses are incorporated into a third memory register.

8. The data processing device according to claim 1 further including a local clock that provides a local clock signal to the device for initiating sending of data bits from the first data storage element to the processing circuit.

9. The data processing device according to claim 1 wherein the control signal initiates the addition of a zero-bit between two specific ones of the data bits based on the counted occurrences of the predetermined data value in the second plurality of memory addresses.

10. The data processing device according to claim 1 wherein the plurality of multiplexers comprises a predetermined number N of multiplexers.

11. The data processing device according to claim 1 wherein the control logic unit is incorporated into the counting circuit.

12. The data processing device according to claim 1 wherein the predetermined data value is 1.

13. A device that processes data bits to generate Non-Return-to-Zero-Inverted-encoded data comprising:
    a first data storage element having a first plurality of memory addresses capable of storing the data bits; and
    a processing circuit, coupled to the first data storage element, that processes in parallel data bits sent from selected ones of the first plurality of memory addresses, to generate Non-Return-to-Zero-Inverted-encoded data.

14. The device according to claim 13 wherein the first plurality of memory addresses are incorporated into a plurality of memory registers.

15. The device according to claim 14 wherein plurality of memory registers comprises a first memory register and a second memory register.

16. The device according to claim 15 wherein the first memory register has a predetermined number N of memory addresses.

17. The device according to claim 13 further including a local clock that provides a local clock signal to the device.

18. The device according to claim 13 wherein the processing circuit comprises a plurality of logic blocks, each logic block having at least one exclusive-NOR logic gate.

19. The device according to claim 18 wherein the plurality of logic blocks comprises a predetermined number N of logic blocks.

20. The device according to claim 18 wherein at least a portion of the data bits in the first plurality of memory addresses comprise bit-stuffed data.

21. The device according to claim 13 wherein at least a portion of the data bits in the first plurality of memory addresses comprise raw data.

22. A data processing device that processes Non-Return-to-Zero-Inverted-encoded data to generate Non-Return-to-Zero-Inverted-decoded data comprising:
    a first data storage element having a first plurality of memory addresses capable of storing the Non-Return-to-Zero-Inverted-encoded data; and
    a processing circuit, coupled to the first data storage element, that processes in parallel data bits sent from selected ones of the first plurality of memory addresses, to generate Non-Return-to-Zero-Inverted-decoded data.

23. The data processing device according to claim 22 wherein the first plurality of memory addresses is incorporated into a plurality of memory registers.

24. The data processing device according to claim 23 wherein the plurality of memory registers comprises a first memory register and a second memory register.

25. The data processing device according to claim 24 wherein the first memory register has a predetermined number N of memory addresses.

26. The data processing device according to claim 22 further including a local clock that provides a local clock signal to the device.

27. The data processing device according to claim 22 wherein the first data storage element further includes a second plurality of memory addresses that store the Non-Return-to-Zero-Inverted-decoded data generated by the processing circuit.

28. The data processing device according to claim 27 wherein the second plurality of memory addresses comprises a predetermined number N of memory addresses.

29. The data processing device according to claim 22 further comprising a second data storage element having a second plurality of memory addresses that store the Non-Return-to-Zero-Inverted-decoded data generated by the processing circuit.

30. The data processing device according to claim the 29 wherein the second plurality of memory addresses comprises a predetermined number N of memory addresses.

31. The data processing device according to claim 22 wherein the processing circuit comprises a plurality of logic blocks, each logic block having at least one exclusive-NOR logic gate.

32. The data processing device according to claim 31 wherein the plurality of logic blocks comprises a predetermined number N of logic blocks.

33. A device that processes bit-stuffed data bits to generate raw data comprising:
a first data storage element having a first plurality of memory addresses that stores the bit-stuffed data; and
a processing circuit coupled to the first data storage element that processes in parallel data bits sent from selected ones of the first plurality of memory addresses to generate raw data,
wherein the processing circuit comprises:
a plurality of multiplexers coupled to the first plurality of memory addresses and which receive data bits from predetermined ones of the first plurality of memory addresses,
a second plurality of memory addresses that is coupled to the plurality of multiplexers and which receives data bits from the plurality of multiplexers,
a counting circuit that is coupled to the plurality of multiplexers and the second plurality of memory addresses and which counts the occurrences of a predetermined data value in the second plurality of memory addresses, and
a control logic unit which provides a control signal to the plurality of multiplexers based on the occurrences of the predetermined data value counted by the counting circuit.

34. The device according to claim 33 further including a local clock that provides a local clock signal to the device.

35. The data processing device according to claim 33 wherein the processing circuit redetermines, based on the control signal, the selected ones of the first plurality of memory addresses from which data bits are sent from the plurality of multiplexers.

36. The data processing device according to claim 33 wherein the plurality of multiplexers comprises a predetermined number N of multiplexers.

37. The data processing device according to claim 33 wherein the first data storage element includes another plurality of memory addresses that receive the raw data.

38. The data processing device according to claim 33 further comprising a second data storage element having another plurality of memory addresses that receive the raw data.

39. A method for processing raw data bits to generate bit-stuffed data comprising the steps of:
sending data bits in parallel from selected addresses of a first plurality of memory addresses to a processing circuit; and
processing in parallel data bits received from the selected ones of the plurality of memory addresses to generate bit-stuffed data by adding at least one zero-bit to the received data bits,
wherein the step of processing comprises:
receiving the data bits in a plurality of multiplexers residing in the processing circuit;
sending the bit stuffed data form the plurality of multiplexers to a second plurality of memory addresses in the processing circuit;
providing a control signal from a control logic unit located in the processing circuit to the plurality of multiplexers based on the counted occurrences of the predetermined at a value.

40. The method according to claim 39 further including the step of receiving a local clock signal from a local clock and wherein the step of receiving a plurality of data bits representing raw data into the first ones of the plurality of memory addresses is based on reception of the local clock signal.

41. The method according to claim 39 further including the step of receiving a local clock signal from a local clock and wherein the step copying is based on reception of the local clock signal.

42. The method according to claim 39 further including the step of receiving a local clock signal from a local clock and wherein the steps of sending, providing and processing data are based on reception of the local clock signal.

43. A method of processing data bits to generate Non-Return-to-Zero-Inverted-encoded data comprising the steps of:
sending data bits in parallel from selected ones of a first plurality of memory addresses to a processing circuit; and
processing, in parallel, data bits from the selected ones of the first plurality of memory addresses to generate Non-Return-to-Zero-Inverted-encoded data.

44. The method according to claim 43 including the step of receiving a plurality of data bits into the first plurality of memory addresses.

45. The method according to claim 44 including the step of receiving a local clock signal provided by a local clock and wherein the step receiving a plurality of data bits into the first plurality of memory addresses is executed based on receipt of the local clock signal.

46. The method according to claim 44 wherein the step of receiving the plurality of data bits into a first plurality of memory addresses comprises receiving the plurality of data bits into a plurality of memory registers.

47. The method according to claim 46 wherein the plurality of memory registers comprises a first memory register and a second memory register.

48. The method according to claim 47 wherein the first memory register has a predetermined number N of memory addresses.

49. The method according to claim 47 wherein the plurality of data bits received in the receiving step comprises a predetermined number N of data bits received in the first memory register.

50. The method according to claim 44 wherein the data bits received in the first plurality of memory addresses represent bit-stuffed data.

51. The method according to claim 44 wherein the data bits received in the first plurality of memory addresses represent raw data.

52. The method according to claim 43 including the step of receiving a local clock signal provided by a local clock and wherein the steps of sending and processing are executed based on receipt of the local clock signal.

53. The method according to claim 43 including the step of assigning a predetermined value to each memory address of a portion of the first plurality of memory addresses prior to the step of receiving.

54. The method according to claim 53 wherein the predetermined value assigned to each memory address of the portion of the first plurality of memory addresses is 1.

55. The method according to claim 43 further including the step of sending Non-Return-to-Zero-Inverted-encoded data from the processing circuit to predetermined ones of the first plurality of memory addresses.

56. The method according to claim 55 wherein the first plurality of memory addresses are incorporated into a plurality of memory registers.

57. The method according to claim 56 wherein the plurality of memory registers comprise a first memory register and a second memory register.

58. The method according to claim 57 wherein the predetermined ones of the first plurality of memory addresses to which Non-Return-to-Zero-Inverted-encoded data is sent reside in the second memory register.

59. The method according to claim 43 wherein the first plurality of memory addresses is incorporated into a first data storage element.

60. The method according to claim 43 further including the step of sending Non-Return-to-Zero-Inverted-encoded data from the processing circuit to a second plurality of memory addresses.

61. The method according to claim 60 wherein the second plurality of memory addresses resides in a first data storage element.

62. The method according to claim 60 wherein the second plurality of memory addresses resides in a second data storage element.

63. A method for processing Non-Return-to-Zero-Inverted-encoded data to generate Non-Return-to-Zero-Inverted-decoded data comprising the steps of:
sending data bits representing Non-Return-to-Zero-Inverted-encoded data in parallel from selected ones of a first and a second plurality of memory addresses to a processing circuit; and
processing, in parallel, data bits from the selected ones of the first and second plurality of memory addresses to generate Non-Return-to-Zero-Inverted-decoded data.

64. The method according to claim 63 including the step of receiving, into the first plurality of memory addresses, the plurality of data bits representing Non-Return-to-Zero-Inverted-encoded data.

65. The method according to claim 64 including the step of receiving a local clock signal from a local clock and wherein the step of receiving a plurality of Non-Return-to-Zero-Inverted-encoded data bits is executed based on reception of the local clock signal.

66. The method according to claim 64 wherein the step of receiving a plurality of Non-Return-to-Zero-Inverted-encoded data bits into a first plurality of memory addresses comprises receiving the Non-Return-to-Zero-Inverted-encoded data bits into a plurality of memory registers.

67. The method according to claim 66 wherein the plurality of memory registers comprises a first memory register and a second memory register.

68. The method according to claim 67 wherein the first memory register has a predetermined number N of memory addresses.

69. The method according to claim 67 wherein the plurality of data bits received in the receiving step comprises N data bits received in the first memory register.

70. The method according to claim 63 including the step of copying the plurality of Non-Return-to-Zero-Inverted-encoded data bits from the first plurality of memory addresses to the second plurality of memory addresses.

71. The method according to claim 70 including the step of receiving a local clock signal from a local clock and wherein the step of copying is executed based on reception of the local clock signal.

72. The method according to claim 63 including the step of receiving a local clock signal from a local clock and wherein the steps of sending and processing are executed based on reception of the local clock signal.

73. The method according to claim 63 including the step of sending Non-Return-to-Zero-Inverted-decoded data from the processing circuit to predetermined ones of the first plurality of memory addresses.

74. The method according to claim 63 wherein the first plurality of memory addresses is incorporated into a first data storage element.

75. The method according to claim 63 including the step of sending Non-Return-to-Zero-Inverted-decoded data from the processing circuit to a third plurality of memory addresses.

76. The method according to claim 75 wherein third plurality of memory addresses resides in the first data storage element.

77. The method according to claim 75 wherein third plurality of memory addresses resides in a second data storage element.

78. A method for processing bit-stuffed data to generate raw data comprising the steps of:
sending data bits representing bit-stuffed data in parallel from selected ones of a first plurality of memory addresses to a processing circuit; and
processing, in parallel, data bits received from the selected ones of the first and second plurality of memory addresses to generate raw data,
wherein the step of processing comprises:
receiving the data bits from predetermined ones of the first plurality of memory addresses in a plurality of multiplexers located in the processing circuit;
sending the data bits form the plurality of multiplexers to a second plurality of memory addresses located in the processing circuit;
counting the number of occurrences of a predetermined data value in the second plurality of memory addresses by a counting circuitry located in the processing circuit; and
providing a control signal to the plurality of multiplexers based on the occurrences of the predetermined data value counted by the counting circuit.

79. The method according to claim 78 including the step of receiving a plurality of data bits representing bit-stuffed data into the first plurality of memory addresses.

80. The method according to claim 79 including the step of receiving a local clock signal from a local clock, and wherein the step of receiving a plurality of data bits representing bit-stuffed data is executed based on reception of the local clock signal.

81. The method according to claim 79 including the step of receiving a local clock signal from a local clock, and wherein the step of copying is executed based on reception of the local clock signal.

82. The method according to claim 78 including the step of receiving a local clock signal from a local clock, and wherein the steps of sending and processing are executed based on reception of the local clock signal.

83. The method according to claim 78 wherein the step of processing comprises the steps of:
receiving, in a third plurality of memory addresses, data bits sent from the selected ones of the first plurality of memory addresses,
counting the number of 1-bits occurring consecutively in the third plurality of memory addresses, and
redetermining, based on the number of 1-bits occurring consecutively in the third plurality of memory addresses, the selected ones of the first plurality of memory addresses from which data bits are to be sent to the processing circuit.

84. The method according to claim 83 including the step of resetting to 0, after the step of redetermining, a value in a buffer in the processing circuit when the number of 1-bits occurring consecutively in the third plurality of memory addresses reaches a predetermined value.

85. The method according to claim 84 wherein the predetermined value is 6.

86. The method according to claim 78 wherein first plurality of memory addresses is contained in a plurality of memory registers.

87. The method according to claim 86 wherein the plurality of memory registers comprise first and a second memory registers.

88. The method according to claim 87 wherein the first memory register has a predetermined number N of memory addresses.

89. A data processing system having a system clock operating at a system clock rate S, comprising:

a local clock operating at a local clock rate L;

a data storage element, coupled to the local clock, that receives a predetermined number N of first data bits in a plurality of memory addresses where N is defined by the relation N=S/L; and a processing circuit, coupled to the local clock, which processes first data bits from selected ones of the plurality of memory addresses to generate a plurality of second data bits.

90. A data processing system having a system clock operating at a system clock rate S, comprising:

a local clock, operating at a local clock rate L;

a data storage element, coupled to the local clock, that stores a plurality of first data bits; and a processing circuit, coupled to the local clock, which processes selected ones of the plurality of first data bits to generate a predetermined number N of second data bits where N is defined by the relation N=S/L.

* * * * *